(12) United States Patent
Furusawa et al.

(10) Patent No.: US 7,767,115 B2
(45) Date of Patent: *Aug. 3, 2010

(54) METAL PARTICLE DISPERSION LIQUID, METHOD FOR MANUFACTURING METAL PARTICLE DISPERSION LIQUID, METHOD FOR MANUFACTURING CONDUCTIVE-FILM-FORMING SUBSTRATE, ELECTRONIC DEVICE AND ELECTRONIC APPARATUS

(75) Inventors: Masahiro Furusawa, Chino (JP); Rumi Shinagawa, Kyoto (JP); Toshimi Fukui, Ohtsu (JP); Junko Nakamoto, Osaka (JP); Kuninori Obata, Kyoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/457,484

(22) Filed: Jun. 12, 2009

(65) Prior Publication Data

US 2009/0250667 A1 Oct. 8, 2009

Related U.S. Application Data

(63) Continuation of application No. 11/373,909, filed on Mar. 14, 2006, now Pat. No. 7,560,051.

(30) Foreign Application Priority Data

| Mar. 18, 2005 | (JP) | 2005-080734 |
| Mar. 18, 2005 | (JP) | 2005-080735 |
| Mar. 18, 2005 | (JP) | 2005-080736 |
| Mar. 18, 2005 | (JP) | 2005-080737 |
| Dec. 6, 2005 | (JP) | 2005-352761 |

(51) Int. Cl.
*H01B 1/22* (2006.01)

(52) U.S. Cl. ......... 252/514; 252/513; 252/512

(58) Field of Classification Search ......... 252/514, 252/512, 513, 519.4, 521.6
See application file for complete search history.

(56) References Cited

U.S. PATENT DOCUMENTS

| 3,718,488 | A | | 2/1973 | Trofimenko et al. |
| 4,443,495 | A | | 4/1984 | Morgan et al. |
| 4,683,082 | A | | 7/1987 | Ehrreich |
| 4,786,437 | A | | 11/1988 | Ehrreich |
| 5,439,865 | A | * | 8/1995 | Abe et al. ............ 502/333 |
| 5,603,865 | A | * | 2/1997 | DePue et al. ............ 524/407 |
| 5,840,215 | A | | 11/1998 | Iyer et al. |
| 5,922,403 | A | | 7/1999 | Tecle |
| 6,103,868 | A | | 8/2000 | Heath et al. |
| 6,190,731 | B1 | | 2/2001 | Tecle |
| 6,372,077 | B1 | | 4/2002 | Tecle |
| 7,285,305 | B2 | | 10/2007 | Furusawa et al. |
| 7,344,583 | B2 | | 3/2008 | Wendland et al. |
| 7,356,921 | B2 | | 4/2008 | Furusawa et al. |
| 7,413,607 | B2 | | 8/2008 | Rakow et al. |
| 7,560,051 | B2 | * | 7/2009 | Furusawa et al. ............ 252/514 |
| 2003/0004362 | A1 | | 1/2003 | Tada et al. |
| 2003/0232128 | A1 | | 12/2003 | Furusawa et al. |
| 2004/0081751 | A1 | | 4/2004 | Nakanishi et al. |
| 2004/0212290 | A1 | | 10/2004 | Ito et al. |
| 2005/0078926 | A1 | | 4/2005 | Mataki et al. |
| 2005/0147963 | A1 | | 7/2005 | Su et al. |
| 2006/0073336 | A1 | | 4/2006 | Zhang et al. |

FOREIGN PATENT DOCUMENTS

| JP | A-63-010316 | 1/1988 |
| JP | A-09-134891 | 5/1997 |
| JP | A-11-076800 | 3/1999 |
| JP | A-11-080647 | 3/1999 |
| JP | A-2000-504374 | 4/2000 |
| JP | A-2000-512339 | 9/2000 |
| JP | A-2001-035184 | 2/2001 |
| JP | A-2001-035255 | 2/2001 |
| JP | A-2001-325831 | 11/2001 |
| JP | A-2002-001096 | 1/2002 |
| JP | A-2002-153738 | 5/2002 |
| JP | A-2002-201284 | 7/2002 |
| JP | A-2002-239372 | 8/2002 |
| JP | A-2002-245854 | 8/2002 |
| JP | A-2002-266002 | 9/2002 |
| JP | A-2002-294307 | 10/2002 |
| JP | A-2002-329945 | 11/2002 |
| JP | A-2002-334618 | 11/2002 |
| JP | A-2002-338850 | 11/2002 |
| JP | A-2003-176455 | 6/2003 |
| JP | A-2003-187640 | 7/2003 |
| JP | A-2003-308729 | 10/2003 |
| JP | A-2003-308730 | 10/2003 |
| JP | A-2003-308731 | 10/2003 |
| JP | A-2003-308732 | 10/2003 |
| WO | WO 2004/016376 A1 | 2/2004 |

* cited by examiner

*Primary Examiner*—Douglas M C Ginty
(74) *Attorney, Agent, or Firm*—Oliff & Berridge, PLC

(57) ABSTRACT

A metal particle dispersion liquid comprises: a compound including a sulfur atom; metal particles whose diameter ranges from 1 to 100 nm and made of a material including a precious metal material; and a dispersion medium. The metal particles is covered by the compound.

7 Claims, 4 Drawing Sheets

METAL PARTICLE DISPERSION LIQUID, METHOD FOR MANUFACTURING METAL PARTICLE DISPERSION LIQUID, METHOD FOR MANUFACTURING CONDUCTIVE-FILM-FORMING SUBSTRATE, ELECTRONIC DEVICE AND ELECTRONIC APPARATUS

This is a Continuation of application Ser. No. 11/373,909 filed Mar. 14, 2006, now U.S. Pat. No. 7,560,051, which claims the benefit of Japanese Patent Application Nos. 2005-080734 filed Mar. 18, 2005, 2005-080735 filed Mar. 18, 2005, 2005-080736 filed Mar. 18, 2005, 2005-080737 filed Mar. 18, 2005 and 2005-352761 filed Dec. 6, 2005. The disclosures of the prior applications are hereby incorporated by reference herein in their entirety.

BACKGROUND OF THE INVENTION

1. Technical Field

The present invention relates to a metal particle dispersion liquid, a method for manufacturing a metal particle dispersion liquid, a method for manufacturing a conductive-film-forming substrate, an electronic device and an electronic apparatus.

2. Related Art

Conductive coatings or films are used for versatile applications, such as electromagnetic shielding for cathode-ray tube monitors, infrared shielding for building materials and automobiles, static shielding for cellular phones and other electronic apparatuses, heat shielding for fogged glass, coating for resin to be conductive, for wiring included in circuit boards and integrated-circuit cards, and for through-holes and circuits.

Examples of methods for making a conductive film include metal vacuum deposition, chemical deposition and ion sputtering. These methods, however, require a complicated process in a vacuum or airtight system and are costly and unsuitable for mass production.

To solve this problem, another method for making a conductive film has been proposed lately that includes applying a metal particle dispersion liquid containing metal particles dispersed in a dispersion medium and heating and burning the dispersion liquid. JP-A-2001-325831 is an example of related art. This method provides a conductive film easily and economically with no process in a vacuum or airtight system required.

The dispersion liquid usually includes a dispersing agent as an additive to disperse metal particles. The dispersing agent needs to be stable in the dispersion liquid but degradable to be removed quickly when the dispersion liquid turns to be a metal film after it is applied.

A highly stable dispersing agent that can increase dispersion is hard to be removed. As a result, it requires a high-temperature burning process to turn the dispersion liquid into a metal film. Moreover, organic components in the agent tend to remain in the metal film, making it difficult to lower the resistance of the film. In contrast, a less stable dispersing agent that can lower the resistance of the film is hard to maintain a sufficient dispersed state of the dispersion liquid. In particular, it is difficult to maintain a stable dispersed state for a long period of time.

SUMMARY

An advantage of the invention is to provide a metal particle dispersion liquid that is highly dispersed and stable in a dispersion medium and can lower a burning temperature to turn the dispersion liquid into a conductive film, such as a wiring and conductive pattern, by using ultraviolet radiation together; also to provide a method for easily and surely manufacturing the metal particle dispersion liquid; a method for manufacturing an efficient and reliable conductive-film-forming substrate; and an efficient and reliable electronic device and electronic apparatus.

A metal particle dispersion liquid according to one aspect of the invention includes: a compound having a sulfur atom, metal particles whose diameter ranges from 1 to 100 nm and made of a material including a precious metal material, and a dispersion medium. The metal particles are covered by the compound.

Accordingly, the metal particles are highly dispersed and stable in the dispersion medium and can lower a burning temperature to turn the dispersion liquid into a conductive film, such as a wiring and conductive pattern, by using ultraviolet radiation together.

It is preferable that a molecule in the compound included in the metal particle dispersion liquid contain a mercapto group and an ester group.

Accordingly, the metal particles are particularly highly dispersed and stable, and a conductive film made by using the dispersion liquid has particularly highly conductivity. Also, the burning temperature to provide the conductive film can be further lowered. Moreover, the conductive film has sufficient conductivity even with ultraviolet radiation under a milder condition.

It is preferable that the compound included in the metal particle dispersion liquid be represented by $HS(CH_2)_nCOOR$ where n is an integer from 1 to 5 and R represents one of a straight chain, branched, and cyclic alkyl group all of which having 1 to 8 carbon atoms.

Accordingly, the metal particles are particularly highly dispersed and stable, and a conductive film made by using the dispersion liquid has particularly highly conductivity. Also, the burning temperature to provide the conductive film can be further lowered. Moreover, since this compound is highly reactive to ultraviolet rays, the conductive film has sufficient conductivity even with ultraviolet radiation under a milder condition.

It is preferable that a molar ratio of the compound included in the metal particle dispersion liquid relative to atoms of the metal particles range from 0.1 to 1.0.

Consequently, it is possible to desirably maintain a highly dispersed state of the metal particles in the dispersion medium for a longer period of time. In addition, a dispersing agent used here can be removed with a smaller amount of energy.

It is preferable that an average molecular weight of the compound included in the metal particle dispersion liquid range from 106 to 260.

Consequently, it is possible to desirably maintain a highly dispersed state of the metal particles in the dispersion medium for a longer period of time. In addition, the dispersing agent can be removed with a smaller amount of energy.

It is preferable that the compound included in the metal particle dispersion liquid be a heterocyclic compound whose molecule contains a sulfur atom.

Accordingly, the metal particles are particularly highly dispersed and stable, and a conductive film made by using the dispersion liquid has particularly highly conductivity. Also, the burning temperature to provide the conductive film can be further lowered. Moreover, the conductive film has sufficient conductivity even with ultraviolet radiation under a milder condition.

It is preferable that a molar ratio of the heterocyclic compound included in the metal particle dispersion liquid relative to atoms of the metal particles range from 0.1 to 1.0.

Consequently, it is possible to desirably maintain a highly dispersed state of the metal particles in the dispersion medium for a longer period of time. In addition, the dispersing agent can be removed with a smaller amount of energy.

It is preferable that a molecule in the heterocyclic compound included in the metal particle dispersion liquid contain a nitrogen atom.

Consequently, it is possible to desirably maintain a highly dispersed state of the metal particles in the dispersion medium for a longer period of time. In addition, the dispersing agent can be removed with a smaller amount of energy.

It is preferable that a circular structure in the heterocyclic compound included in the metal particle dispersion liquid contain a nitrogen atom and/or a sulfur atom.

Consequently, by using the dispersion liquid to make a conductive film, for example, it is possible to surely prevent the heterocyclic compound and its decomposed organic residue from remaining in the conductive film. Therefore, the conductive film has particularly high conductivity.

It is preferable that the heterocyclic compound included in the metal particle dispersion liquid include a functional group that is bonded to a heterocycle in the heterocyclic compound and is able to be coordinated to an atom of the metal particles.

Consequently, the metal particles are particularly highly dispersed. By using the metal particle dispersion liquid to make a conductive film, for example, it is possible to surely prevent the heterocyclic compound and its decomposed organic residue from remaining in the conductive film. Therefore, the conductive film has particularly high conductivity.

It is preferable that an average molecular weight of the heterocyclic compound included in the metal particle dispersion liquid range from 80 to 300.

Consequently, it is possible to desirably maintain a highly dispersed state of the metal particles in the dispersion medium for a longer period of time. In addition, the dispersing agent can be removed with a smaller amount of energy.

It is preferable that the compound included in the metal particle dispersion liquid be a thiol having 8 to 18 carbon atoms.

Accordingly, the metal particles are particularly highly dispersed and stable, and a conductive film made by using the dispersion liquid has particularly highly conductivity. Also, the burning temperature to provide the conductive film can be further lowered. Moreover, the conductive film has sufficient conductivity even with ultraviolet radiation under a milder condition.

It is preferable that the metal particle dispersion liquid satisfy $0.05/A \leq X \leq 1.00/A$ where an average diameter of the metal particles is A nm and a molar ratio of the thiol relative to atoms of the precious metal material is X.

Consequently, it is possible to desirably maintain a highly dispersed state of the metal particles in the dispersion medium for a longer period of time. In addition, the dispersing agent can be removed with a smaller amount of energy.

It is preferable that a peak half width in size distribution of the metal particles included in the metal particle dispersion liquid range from 0.1 to 3.0 nm.

Accordingly, the metal particles are particularly highly dispersed even if they account for a comparatively large portion of the metal particle dispersion liquid. Furthermore, by using the dispersion liquid, for example, it is possible to easily and surely make a conductive film with a minute pattern.

It is preferable that the metal particle dispersion liquid contain beta-ketoester in addition to the compound, the metal particles and the dispersion medium.

Accordingly, the metal particles are particularly highly dispersed and stable, and a conductive film made by using the dispersion liquid has particularly highly conductivity. Also, the burning temperature to provide the conductive film can be further lowered. Moreover, the conductive film has sufficient conductivity even with ultraviolet radiation under a milder condition.

It is preferable that the compound included in the metal particle dispersion liquid be a thiol having 8 or more carbon atoms.

Consequently, it is possible to desirably maintain a highly dispersed state of the metal particles in the dispersion medium for a longer period of time. In addition, the dispersing agent can be removed with a smaller amount of energy.

It is preferable that the beta-ketoester included in the metal particle dispersion liquid have a structure represented by Chemical Formula 1.

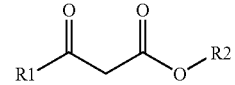

Chemical Formula 1

R1: Fluorine-substituted alkyl group.
R2: Straight chain, branched, or cyclic alkyl group having 1 to 8 carbon atoms.

Accordingly, the metal particles are particularly highly dispersed and stable, and a conductive film made by using the dispersion liquid has particularly highly conductivity. Also, the burning temperature to provide the conductive film can be further lowered. Moreover, since this compound is highly reactive to ultraviolet rays, the conductive film has sufficient conductivity even with ultraviolet radiation under a milder condition.

It is preferable that a molar ratio of the beta-ketoester included in the metal particle dispersion liquid relative to atoms of the metal particles range from 0.1 to 0.4.

Consequently, it is possible to desirably maintain a highly dispersed state of the metal particles in the dispersion medium for a longer period of time. In addition, the dispersing agent can be removed with a smaller amount of energy.

It is preferable that an average molecular weight of the beta-ketoester included in the metal particle dispersion liquid range from 140 to 400.

Consequently, it is possible to desirably maintain a highly dispersed state of the metal particles in the dispersion medium for a longer period of time. In addition, the dispersing agent can be removed with a smaller amount of energy.

It is preferable that the precious metal material included in the metal particle dispersion liquid be Ag.

Accordingly, the metal particles have particularly high conductivity. Furthermore, a conductive film made by using the dispersion liquid has particularly highly conductivity.

It is preferable that a content of the metal particles included in the metal particle dispersion liquid range from 10 to 60 wt %.

Accordingly, the metal particles are particularly highly dispersed in the dispersion liquid.

A method for manufacturing the above-mentioned metal particle dispersion liquid according to another aspect of the invention includes: preparing a two-phase liquid including a precious metal salt to be the metal particles, the compound, a water polar liquid, a nonpolar liquid that is insoluble to the water polar liquid, and a phase-transfer catalyst; adding a reducing agent to the two-phase liquid to make the metal particles covered by the compound; separating a nonpolar liquid phase composed of the nonpolar liquid together with the metal particles; mixing the separated nonpolar liquid phase and an alcohol having 1 to 3 carbon atoms to make the metal particles precipitate; and dispersing the precipitating metal particles in a liquid functioning as a dispersion medium.

It is thus easily and surely manufacture the metal particle dispersion liquid in which the metal particles are highly dispersed and stable in the dispersion medium and can lower a burning temperature to turn the dispersion liquid into a conductive film by using ultraviolet radiation together.

A method for manufacturing a conductive-film-forming substrate according to a yet another aspect of the invention includes the above-mentioned method for manufacturing the metal particle dispersion liquid.

This method provides an efficient and reliable conductive-film-forming substrate.

A method for manufacturing a conductive-film-forming substrate according to a still another aspect of the invention includes: depositing the metal particle dispersion liquid on a substrate to form an application film; and turning the application film into a conductive film. Turning the application film into a conductive film includes: irradiating the application film with ultraviolet rays; and heating the application film.

This method provides an efficient and reliable conductive-film-forming substrate.

It is preferable that the heating be at 150 degrees Celsius or less in the method for manufacturing a conductive-film-forming substrate.

Since a heating temperature can be thus kept low, it is possible to provide a particularly reliable conductive-film-forming substrate.

An electronic device according to another aspect of the invention is manufactured by the above-described method for manufacturing a conductive-film-forming substrate.

Accordingly, it is possible to provide an efficient and reliable electronic device.

An electronic apparatus according to yet another aspect of the invention includes the above-described electronic device.

Accordingly, it is possible to provide an efficient and reliable electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
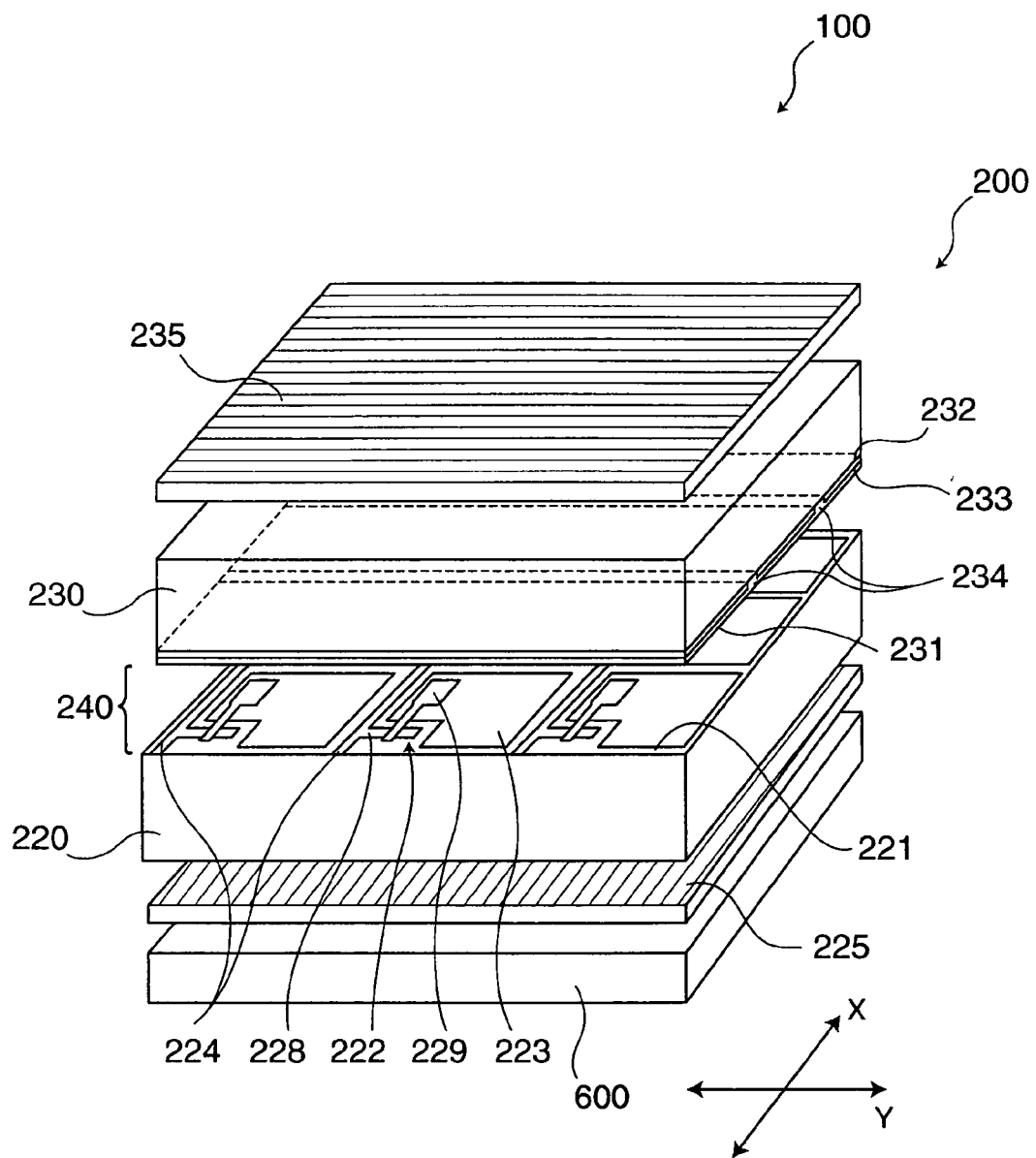
FIG. 1 is an exploded perspective view showing an electronic device according to one embodiment of the invention that is applied to a transmissive liquid crystal display.

Preferred embodiments of the invention will be described hereinafter with reference to the accompanying drawings.

Metal Particle Dispersion Liquid

A metal particle dispersion liquid according to preferred embodiments of the invention will be explained.

The metal particle dispersion liquid is composed of a compound containing a sulfur atom (hereinafter referred to as the "sulfur-containing compound") and a precious metal material. The dispersion liquid includes metal particles (dispersed substance) whose diameters range from 1 to 100 nm and a dispersion medium. The metal particles in the dispersion liquid are covered by the sulfur-containing compound.

The term "metal particle dispersion liquid," as used herein, refers to a liquid in which metal particles are dispersed and includes a colloidal liquid (solution).

First Embodiment

A metal particle dispersion liquid according to a first embodiment of the invention will now be described.

This metal particle dispersion liquid includes metal particles (dispersed substance) mainly made of a precious metal material. The dispersion liquid also includes a dispersion medium and a compound whose molecule contains a mercapto group and an ester group (hereinafter referred to as the "mercapto-and-ester-group-containing compound"). In other words, the dispersion liquid includes the mercapto-and-ester-group-containing compound as the sulfur-containing compound.

Metal Particles

The metal particles are mainly made of a precious metal material.

By using the metal particle dispersion liquid including the metal particles mainly made of a precious metal material to make a conductive film, including a wiring or conductive pattern, for example, the conductive film becomes highly conductive. In particular, since precious metal materials generally have high chemical stability, it is possible to maintain high conductivity for a long period of time. Precious metal materials also have high affinity for sulfur-containing compounds (e.g. the mercapto-and-ester-group-containing compound in the present embodiment) as will be described in greater detail below. Consequently, the metal particles made of a precious metal material are highly dispersed in the dispersion liquid.

While any metal particles mainly made of a precious metal material can be used here, the precious metal material may account for 90 wt % and more in particle components preferably, or 95 wt % and more in the components more preferably. Further preferably, the precious metal material is practically the only component of the metal particles (e.g. accounting for 99.9 wt % and more). Consequently, the metal particles can exhibit the above-described effects more markedly.

Examples of the precious metal material of the metal particles include Ag, Au, Pt, Pd, Ru, Rh, Os and Ir. Among them, Ag is preferably used as the precious metal material of the metal particles. Since Ag has particularly high conductivity among the other precious metal materials, the conductive film made by using the dispersion liquid including the metal particles mainly made of Ag has particularly high conductivity.

The metal particles may be substantially made of a metal simple substance or a plurality of components like an alloy.

Moreover, the metal particles may include other components than the precious metal material (precious metal atoms), such as Cu, Al, Ni, Sn and Mg.

While the average diameter of the metal particles ranges from 1 to 100 nm, it is preferably from 3 to 20 nm and more preferably from 3 to 7 nm. If the average diameter of the metal particles falls in the above-mentioned range, the metal particles are particularly highly dispersed even if they account for a comparatively large portion of the metal particle dispersion liquid. Furthermore, by using the metal particle dispersion liquid, for example, it is possible to easily and surely make a conductive film with a minute pattern. If the average diameter of the metal particles fails to reach the above-mentioned lower limit on one hand, the conductive film made by using the dispersion liquid may include many residual organic components depending on the content of the metal particles or of the sulfur-containing compound, for example. As a result, the conductivity of the conductive film tents to decline and the metal particles in the dispersion liquid tend to aggregate, lowering the dispersion stability of the particles. On the other hand, if the average diameter of the metal particles exceeds the above-mentioned upper limit, the dispersion stability of the metal particles tend to decline depending on the content of the metal particles or of the sulfur-containing compound, for example. Furthermore, if the average diameter exceeds the upper limit, it is possibly difficult to make a conductive film with a required minute pattern by using the dispersion liquid, for example.

While the peak half width in size distribution of the metal particles is not particularly limited, it may range from 0.1 to 3.0 nm preferably, and from 0.5 to 2.0 nm more preferably. If the peak half width in size distribution of the metal particles falls in the above-mentioned range, the metal particles are particularly highly dispersed even if they accounts for a comparatively large portion of the metal particle dispersion liquid. Moreover, it is possible to reduce the variance of each particle's dispersion in the dispersion liquid. Therefore, the dispersion liquid becomes highly reliable and stable. Furthermore, by using the dispersion liquid, for example, it is possible to easily and surely make a conductive film with a minute pattern.

While the content of the metal particles in the dispersion liquid is not particularly limited, it may range from 10 to 80 wt % preferably, from 20 to 60 wt % more preferably, and from 40 to 60 wt % further preferably. If the content of the metal particles falls in the above-mentioned range, the metal particles can maintain a highly dispersed state in the dispersion liquid for a long period of time. Furthermore, by using the dispersion liquid, for example, it is possible to efficiently make a conductive film with a small amount of the dispersion liquid.

Dispersion Medium

The dispersion medium functions as a medium to disperse the metal particles in the dispersion liquid.

Examples of materials of the dispersion medium include: methanol, ethanol, isopropanol, butanol, octanol, ethylene glycol, diethylene glycol, glycerin, terpineol (e.g. alpha-terpineol, beta-terpineol, gamma-terpineol) and other alcohols; methyl cellosolve, ethyl cellosolve, phenyl cellosolve and other cellosolves; diethyl ether, tetrahydrofuran and other ethers; methyl acetate, ethyl acetate, butyl acetate, ethyl formate and other esters; acetone, methyl ethyl ketone, diethyl ketone, methyl isobutyl ketone, methyl isopropyl ketone, cyclohexanone and other ketones; pentane, hexane, octane, tridecane and other aliphatic hydrocarbons (paraffinic hydrocarbons); cyclohexane, methylcyclohexane, tetralin, limonene and other alicyclic hydrocarbons; benzene, toluene, xylene, hexylbenzene, butylbenzene, octylbenzene, nonylbenzene, decylbenzene, undecylbenzene, dodecylbenzene, tridecylbenzene, tetradecylbenzen and other benzenes having a long-chain alkyl group (alkylbenzene derivatives); tetralin and other aromatic hydrocarbons; methylene chloride, chloroform, carbon tetrachloride, 1,2-dichloroethane and other halogenated hydrocarbons; pyridine, pyrazine, furan, pyrrole, thiophene, methylpyrrolidone and other aromatic heterocycles; acetonitrile, propionitrile, acrylonitrile and other nitriles; N,N-dimethylformamide, N,N-dimethylacetamide and other amides; and mineral spirits. One of them or two or more of them in combination can be used. Among them, the dispersion medium is preferably composed of a material whose molecule has a circular structure having an unsaturated bond, such as terpineol (e.g. alpha-terpineol, beta-terpineol, gamma-terpineol), tetralin, limonene, aromatic hydrocarbons, and aromatic heterocycles. If the dispersion medium is composed of these materials, the metal particles are particularly highly dispersed.

Mercapto-and-Ester-Group-Containing Compound

As described above, the metal particle dispersion liquid according to the present embodiment includes the mercapto-and-ester-group-containing compound whose molecule contains a mercapto group and an ester group.

With the mercapto-and-ester-group-containing compound, the metal particles are highly dispersed in the metal particle dispersion liquid. In particular, the inventor of the invention has found that the metal particles are highly dispersed for a long period of time with no agitation required.

The inventor has also found that the metal particle dispersion liquid including the mercapto-and-ester-group-containing compound can be desirably applied to making of a conductive film, such as metal wiring. Thus, by using the dispersion liquid to form a film in a predetermined shape and then removing the dispersion medium and dispersing agent (mercapto-and-ester-group-containing compound) from the film to complete a conductive film, a desirable pattern, particularly a minute pattern, can be formed easily and surely. Also, the conductive film has high conductivity.

This is because the mercapto-and-ester-group-containing compound as the dispersing agent has affinity for the metal particles, stability at room temperature, and degradability at low temperature. This compound as the dispersing agent is degradable to be removed quickly with heat at low temperature, while the dispersion liquid is stable. Moreover, since an ester group reacts to ultraviolet rays, the dispersing agent is degradable to be removed by burning at lower temperature together with ultraviolet radiation.

If the dispersion liquid includes no mercapto-and-ester-group-containing compound, the above-mentioned effects are not available. For example, the effects of the present embodiment are not available if a compound having a mercapto group with no ester group or a compound having an ester group with no mercapto group is used, or even if both of these compounds are used together.

While any mercapto-and-ester-group-containing compound can be used here as long as its molecule has a mercapto group and an ester group, it may preferably have a structure, for example, represented by the chemical formula: $HS(CH_2)_n COOR$ (n is an integer from 1 to 5, R represents a straight chain, branched, or cyclic alkyl group having 1 to 8 carbon atoms).

With the mercapto-and-ester-group-containing compound having this structure, the metal particles are particularly highly dispersed. Moreover, by using the dispersion liquid to make a conductive film, for example, it is possible to surely prevent the mercapto-and-ester-group-containing compound and its decomposed organic residue from remaining in the conductive film. Therefore, the conductive film has particularly high conductivity.

While the average molecular weight of the mercapto-and-ester-group-containing compound is not particularly limited, it may range from 110 to 250 preferably, from 120 to 240 more preferably, and from 130 to 215 further preferably. If the average molecular weight of the mercapto-and-ester-group-containing compound falls in the above-mentioned range, the metal particles are particularly highly dispersed. Moreover, by using the dispersion liquid to make a conductive film, for example, it is possible to surely prevent the mercapto-and-ester-group-containing compound from remaining in the conductive film. Therefore, the conductive film has particularly high conductivity.

While the content of the mercapto-and-ester-group-containing compound in the metal particle dispersion liquid is not particularly limited, its molar ratio relative to the metal atoms may range from 0.1 to 1.0 preferably, from 0.3 to 1.0 more preferably, and from 0.3 to 0.5 further preferably. If the content of the mercapto-and-ester-group-containing compound falls in the above-mentioned range, the metal particles are particularly highly dispersed even if they account for a comparatively large portion of the dispersion liquid. Moreover, by using the dispersion liquid to make a conductive film, for example, it is possible to surely prevent the mercapto-and-ester-group-containing compound from remaining in the conductive film. Therefore, the conductive film has particularly high conductivity.

Moreover, the metal particle dispersion liquid may include other components. For example, the dispersion liquid may include other dispersing agents than the mercapto-and-ester-group-containing compound. Examples of such dispersing agents include: trisodium citrate, tripotassium citrate, trilithium citrate, disodium malate, disodium tartrate, sodium glycolate and other ionic compounds; hexanethiol, heptanethiol, octanethiol, nonanethiol, decanethiol, undecanethiol, dodecanethiol, tridecanethiol, tetradecanethiol, pentadecanethiol and other thiols; sodium dodecylbenzene sulfonate, sodium oleate, polyoxyethylene alkyl ether, perfluoroalkyl ethylene oxide adducts and other surface active agents; gelatin, gum arabic, albumin, polyethylenimine, polyvinyl celluloses, alkanethiols and other polymer compounds. One of them or two or more of them in combination can be used.

Second Embodiment

A metal particle dispersion liquid according to a second embodiment of the invention will now be described.

This metal particle dispersion liquid includes metal particles (dispersed substance) mainly made of a precious metal material. The dispersion liquid also includes a dispersion medium and a heterocyclic compound whose molecule contains a nitrogen atom and a sulfur atom. The heterocyclic compound serves as a dispersing agent. This means that the metal particle dispersion liquid according to the present embodiment includes the heterocyclic compound whose molecule contains a sulfur atom as the sulfur-containing compound. In other words, the dispersion liquid includes the heterocyclic compound whose molecule contains a sulfur atom (hereinafter simply referred to as the "heterocyclic compound") serving as a dispersing agent.

Metal Particles

The metal particles according to the present embodiment are the same as those in the first embodiment.

Since precious metal materials have high affinity for the heterocyclic compound as the sulfur-containing compound, the metal particles made of a precious metal material are highly dispersed in the dispersion liquid.

Dispersion Medium

The dispersion medium according to the present embodiment is the same as that in the first embodiment.

Heterocyclic Compound: Dispersing Agent

As mentioned above, the metal particle dispersion liquid according to the present embodiment includes the heterocyclic compound serving as the dispersing agent.

With the heterocyclic compound, the metal particles are highly dispersed in the metal particle dispersion liquid. In particular, the inventor of the invention has discovered that the metal particles are highly dispersed for a long period of time with no agitation required.

The inventor has also discovered that the metal particle dispersion liquid including the heterocyclic compound can be desirably applied to making of a conductive film, such as metal wiring. Thus, by using the dispersion liquid to form a film in a predetermined shape and then removing the dispersion medium and dispersing agent from the film to complete a conductive film, a desirable pattern, particularly a minute pattern, can be formed easily and surely. Also, the conductive film has high conductivity.

This is because the heterocyclic compound as the dispersing agent has affinity for the metal particles, stability at room temperature, and degradability at low temperature. This compound as the dispersing agent is degradable to be removed quickly with heat at low temperature, while the dispersion liquid is stable. Moreover, since the heterocyclic compound reacts to ultraviolet rays, the dispersing agent is degradable to be removed by burning at lower temperature together with ultraviolet radiation.

If the dispersion liquid includes no heterocyclic compound, the above-mentioned effects are not available. For example, the effects of the present embodiment are not available when using a sulfur-containing compound containing no heterocycle or a heterocyclic compound containing no sulfur atom (e.g. a heterocyclic compound containing any of the following as a heteroatom: oxygen, boron, aluminum, silicon, phosphorous, tin, arsenic and copper).

Any heterocyclic compound can be used here, as long as their molecules have a sulfur atom. For example, their heterocycles may have a sulfur atom (as a heteroatom included in the heterocycles). Otherwise, they may have a sulfur atom out of their heterocycles, which means they have other atoms than sulfur as a heteroatom included in the heterocycles.

While any heterocyclic compound can be used as long as its molecule has a sulfur atom, its molecule may preferably have a nitrogen atom. Consequently, it is possible to desirably maintain a highly dispersed state of the metal particles in the dispersion medium for a longer period of time. In addition, the dispersing agent can be removed with a smaller amount of energy.

The heterocyclic compound preferably includes an unsaturated bond in its circular structure. Consequently, by using the dispersion liquid to make a conductive film, for example, it is possible to surely prevent the heterocyclic compound and its decomposed organic residue from remaining in the conductive film. Therefore, the conductive film has particularly high conductivity.

The heterocyclic compound preferably includes a nitrogen atom and/or a sulfur atom in its circular structure. Consequently, by using the dispersion liquid to make a conductive film, for example, it is possible to surely prevent the heterocyclic compound and its decomposed organic residue from remaining in the conductive film. Therefore, the conductive film has particularly high conductivity.

In addition, the heterocyclic compound preferably includes a functional group that is bonded to its heterocycle and is able to be coordinated to precious metal atoms included in the metal particles. Consequently, the metal particles are particularly highly dispersed. By using the dispersion liquid to make a conductive film, for example, it is possible to surely prevent the heterocyclic compound and its decomposed organic residue from remaining in the conductive film. Therefore, the conductive film has particularly high conductivity. Examples of the functional group include mercapto, amino, carboxyl and hydroxyl groups. Among them, mercapto groups are preferably used. If the heterocyclic compound includes a mercapto group bonded to its heterocycle, the above-described effects can be achieved more markedly.

As the heterocyclic compound, compounds having structures represented by Chemical Formulae 2 to 8 can be used.

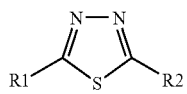

Chemical Formula 2

R1, R2 (each): Hydrogen, hydrocarbon having 1 to 3 carbon atoms, mercapto group, amino group, or hydroxyl group.

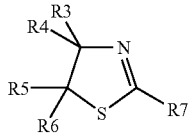

Chemical Formula 3

R3, R4, R5, R6, R7 (each): Hydrogen, hydrocarbon having 1 to 3 carbon atoms, mercapto group, amino group, or hydroxyl group.

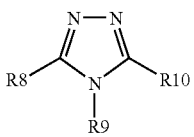

Chemical Formula 4

R8, R9, R10: At least one of them is a mercapto group. Each of the rest of them is hydrogen, a hydrocarbon having 1 to 3 carbon atoms, an amino group, or a hydroxyl group.

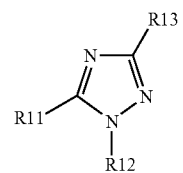

Chemical Formula 5

R11, R12, R13: At least one of them is a mercapto group. Each of the rest of them is hydrogen, a hydrocarbon having 1 to 3 carbon atoms, an amino group, or a hydroxyl group.

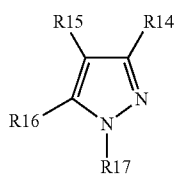

Chemical Formula 6

R14, R15, R16, R17: At least one of them is a mercapto group. Each of the rest of them is hydrogen, a hydrocarbon having 1 to 3 carbon atoms, an amino group, or a hydroxyl group.

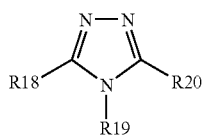

Chemical Formula 7

R18, R19, R20: At least one of them is a mercapto group. Each of the rest of them is hydrogen, a hydrocarbon having 1 to 3 carbon atoms, an amino group, or a hydroxyl group.

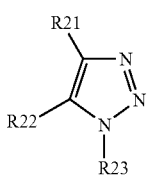

Chemical Formula 8

R21, R22, R23: At least one of them is a mercapto group. Each of the rest of them is hydrogen, a hydrocarbon having 1 to 3 carbon atoms, an amino group, or a hydroxyl group.

Among them, the compounds having the structures represented by Chemical Formulae 2 and 3 are preferably used. With the heterocyclic compound having any of these structures, the metal particles are particularly highly dispersed. By using the metal particle dispersion liquid to make a conductive film, for example, it is possible to surely prevent the heterocyclic compound and its decomposed organic residue from remaining in the conductive film. Therefore, the conductive film has particularly high conductivity.

While the average molecular weight of the heterocyclic compound is not particularly limited, it may range from 80 to 300 preferably, from 85 to 128 more preferably, and from 90 to 120 further preferably. If the average molecular weight of the heterocyclic compound falls in the above-mentioned range, the metal particles are particularly highly dispersed. Moreover, by using the dispersion liquid to make a conductive film, for example, it is possible to surely prevent the heterocyclic compound from remaining in the conductive film. Therefore, the conductive film has particularly high conductivity.

While the content of the heterocyclic compound in the metal particle dispersion liquid is not particularly limited, its molar ratio relative to the atoms of the metal particles may range from 0.1 to 1.0 preferably, from 0.3 to 1.0 more preferably, and from 0.3 to 0.5 further preferably. If the content of the heterocyclic compound falls in the above-mentioned range, the metal particles are particularly highly dispersed even if they account for a comparatively large portion of the metal particle dispersion liquid. Moreover, by using the dispersion liquid to make a conductive film, for example, it is possible to surely prevent the heterocyclic compound from remaining in the conductive film. Therefore, the conductive film has particularly high conductivity.

Moreover, the metal particle dispersion liquid may include other components. For example, the dispersion liquid may include other dispersing agents than the heterocyclic compound. Examples of such dispersing agents include: trisodium citrate, tripotassium citrate, trilithium citrate, disodium malate, disodium tartrate, sodium glycolate and other ionic compounds; hexanethiol, heptanethiol, octanethiol, nonanethiol, decanethiol, undecanethiol, dodecanethiol, tridecanethiol, tetradecanethiol, pentadecanethiol and other thiols; sodium dodecylbenzene sulfonate, sodium oleate, polyoxyethylene alkyl ether, perfluoroalkyl ethylene oxide adducts and other surface active agents; gelatin, gum arabic, albumin, polyethylenimine, polyvinyl celluloses, alkanethiols and other polymer compounds; and the mercapto-and-ester-group-containing compound described in the first embodiment. One of them or two or more of them in combination can be used.

Third Embodiment

A metal particle dispersion liquid according to a third embodiment of the invention will now be described.

This metal particle dispersion liquid includes metal particles (dispersed substance) mainly made of a precious metal material. The dispersion liquid also includes a dispersion medium and a thiol having 8 to 18 carbon atoms (hereinafter also simply referred to as the "thiol"). In other words, the metal particle dispersion liquid according to the present embodiment includes the thiol having 8 to 18 carbon atoms as the sulfur-containing compound.

Metal Particles

The metal particles according to the present embodiment are the same as those in the first embodiment.

Since precious metal materials have high affinity for the thiol as the sulfur-containing compound, the metal particles made of a precious metal material are highly dispersed in the dispersion liquid.

Dispersion Medium

The dispersion medium according to the present embodiment is the same as that in the first embodiment.

Thiol

As mentioned above, the metal particle dispersion liquid according to the present embodiment includes the thiol having 8 to 18 carbon atoms as a dispersing agent.

Examples of the thiol include: octanethiol (e.g. 1-octanethiol, 2-octanethiol), nonanethiol, decanethiol, undecanethiol, dodecanethiol, tridecanethiol, tetradecanethiol, pentadecanethiol, hexadecanethiol, heptadecanethiol, octadecanethiol and compounds obtained by introducing a substituent group (e.g. a halogen group or two or more mercapto groups) into molecules of any of the thiols. One of them or two or more of them in combination can be used. The thiol having 8 to 18 carbon atoms may have two or more mercapto groups in its molecule, for example.

With the thiol having any of these structures, the metal particles are particularly highly dispersed in the dispersion liquid. Having paid attention to the relationship between the size of the metal particles and the content of the dispersing agent required to desirably disperse the metal particles, the inventor of the invention has discovered that the content of the thiol that satisfies a certain relation with the average diameter of the metal particles can highly disperse the metal particles in the dispersion liquid. At the same time, by using the dispersion liquid to make a conductive film as described below (particularly when using ultraviolet radiation), for example, it is possible to effectively prevent the thiol (dispersing agent) from remaining in the conductive film even with processing under a comparatively mild condition (e.g. at comparatively low temperature). Therefore, the conductive film has particularly high conductivity.

The certain relation according to the present embodiment is represented by the following formula: $0.05/A \leq X \leq 1.00/A$ where the average diameter of the metal particles is A nm and the content of the thiol, i.e. its molar ratio relative to atoms of the precious metal material, in the dispersion liquid is X. When the formula is satisfied, the above-mentioned effects can be achieved. If the content X fails to reach the lower limit on one hand, the above-mentioned effects are not available and the metal particles are not desirably dispersed. On the other, if the dispersion liquid is used to make a conductive film as described below for example, with the content X exceeding the upper limit, the thiol will remain in the conductive film. As a result, the conductive film has poor conductivity.

The formula is based on the following idea. When the average diameter of the metal particles is 5 nm, the molar ratio of the thiol relative to the metal atoms needs to be 0.01 to 0.20 in order to achieve the above-mentioned effects. The amount of the thiol falling in this range is not large enough to cover and protect the surface of every metal particle (a molar ratio of about 0.30 at least is required to cover the surface of every metal particle whose diameter is 5 nm), but is sufficient to disperse the metal particles desirably. Thus the inventor of the invention has found that the dispersion liquid including the thiol of the amount within the range can provide both dispersion stability in and degradability at low temperature (particularly when using ultraviolet radiation together).

If the diameter of the metal particles increases in the dispersion liquid with the total number of the metal atoms unchanged, the surface area of each metal particle increases but the total amount of the metal particles decreases to a larger extent. As a result, the amount of the thiol, which is required to cover the surface of the metal particles to the same extent that it covers the original metal particles, declines in inverse proportion to the diameter of the metal particles. The inventor of the invention has set the above formula based on the fact that the same effects as the molar ratio of 0.01 to 0.20 with the diameter of 5 nm can be achieved when the molar ratio falls in the range from $0.01*5/A$ to $0.20*5/A$ with the diameter of A in inverse proportion to the diameter of the metal particles (when their diameters range from 1 to 100 nm). It is understood that the formula is satisfied generally as for particles made of precious metal materials, such as other precious metal materials than Ag, and precious metal alloys, since the diameter of a particle made of the same number of atoms is almost the same.

According to the present embodiment, the average diameter (A nm) of the metal particles and the content (X) of the thiol, i.e. its molar ratio relative to atoms of the precious metal, in the dispersion liquid satisfy the formula: $0.05/A \leq X \leq 1.00/A$ as mentioned above. Preferably, they may satisfy the formula: $0.10/A \leq X \leq 1.00/A$. More preferably, they may satisfy the formula: $0.20/A \leq X \leq 0.50/A$. When the formula is satisfied, the above-described effects can be achieved more markedly.

The above-mentioned effects are available only when the thiol having 8 to 18 carbon atoms is used and not available when other dispersing agents than the thiol having 8 to 18 carbon atoms are used. In other words, when thiols having 7 or less or having 19 or more carbon atoms or other dispersing agents than thiols are used, the above-mentioned effects are not available even if such dispersing agents and the metal particles satisfy the above formula.

While the content of the thiol having 8 to 18 carbon atoms (molar ratio relative to atoms of the precious metal) in the metal particle dispersion liquid is not particularly limited, it may range from 0.001 to 0.500 preferably, and from 0.010 to 0.200 more preferably. If the content of the thiol having 8 to 18 carbon atoms falls in the above-mentioned range, the metal particles are particularly highly dispersed even if they account for a comparatively large portion of the metal particle dispersion liquid. At the same time, by using the dispersion liquid to make a conductive film, it is possible to surely prevent the thiol from remaining in the conductive film. Therefore, the conductive film has particularly high conductivity.

Moreover, the metal particle dispersion liquid may include other components. For example, the dispersion liquid may include other dispersing agents than the thiol having 8 to 18 carbon atoms. Examples of such dispersing agents include: trisodium citrate, tripotassium citrate, trilithium citrate, disodium malate, disodium tartrate, sodium glycolate and other ionic compounds; butanethiol, pentanethiol, hexanethiol, heptanethiol and other thiols having 7 or less carbon atoms; nonadecanethiol, icosanethiol and other thiols having 19 or more carbon atoms; sodium dodecylbenzene sulfonate, sodium oleate, polyoxyethylene alkyl ether, perfluoroalkyl ethylene oxide adducts and other surface active agents; gelatin, gum arabic, albumin, polyethylenimine, polyvinyl celluloses, alkanethiols and other polymer compounds; and the mercapto-and-ester-group-containing compound described in the first embodiment; and the heterocyclic compound described in the second embodiment. One of them or two or more of them in combination can be used. When such a dispersing agent other than the thiol having 8 to 18 carbon atoms is contained, the content of this agent (its molar ratio relative to the thiol) in the metal particle dispersion liquid is preferably 0.5 or less.

Fourth Embodiment

A metal particle dispersion liquid according to a fourth embodiment of the invention will now be described.

This metal particle dispersion liquid includes metal particles (dispersed substance) mainly made of a precious metal material. The dispersion liquid also includes a dispersion medium, a sulfur-containing compound as a dispersing agent, and beta-ketoester as a dispersing aid. In other words, the dispersion liquid according to the present embodiment includes beta-ketoester in addition to the sulfur-containing compound.

Metal Particles

The metal particles according to the present embodiment are the same as those in the first embodiment.

Since precious metal materials have high affinity for beta-ketoester, which will be described in greater detail later, the metal particles made of a precious metal material are highly dispersed in the dispersion liquid.

Dispersion Medium

The dispersion medium according to the present embodiment is the same as that in the first embodiment.

Dispersing Agent and Beta-Ketoester

As mentioned above, the metal particle dispersion liquid according to the present embodiment includes the sulfur-containing compound as the dispersing agent and beta-ketoester as the dispersing aid.

With the dispersing agent and the beta-ketoester, the metal particles are highly dispersed in the metal particle dispersion liquid. In particular, the inventor of the invention has discovered that the metal particles are highly dispersed for a long period of time with no agitation required.

The inventor has also discovered that the metal particle dispersion liquid including the dispersing agent and the beta-ketoester can be desirably applied to making of a conductive film, such as metal wiring. Thus, by using the dispersion liquid to form a film in a predetermined shape and then removing the dispersion medium from the film to complete a conductive film, a desirable pattern, particularly a minute pattern, can be formed easily and surely. Also, the conductive film has high conductivity.

This is because the dispersing agent and the beta-ketoester function synergistically. Compared to the use of the dispersing agent alone (no beta-ketoester used), the metal particles are highly dispersed even if the content of the dispersing agent (the total content of the dispersing agent and the beta-ketoester as the dispersing aid) is significantly low. Accordingly, the dispersing agent (and the beta-ketoester) can be easily and surely removed to complete a conductive film. Therefore, it is possible to make the conductive film have particularly high conductivity.

The above-mentioned effects are not available if the dispersing agent and the beta-ketoester are not used together. For example, the effects of the present embodiment are not available if the metal particle dispersion liquid includes the dispersing agent but no beta-ketoester, or includes the beta-ketoester but no dispersing agent.

Dispersing Agent

The dispersing agent mainly functions to disperse the metal particles.

Examples of the dispersing agent include: hexanethiol, heptanethiol, octanethiol, nonanethiol, decanethiol, undecanethiol, dodecanethiol, tridecanethiol, tetradecanethiol, pentadecanethiol and other thiols; sodium dodecylbenzene sulfonate and other surface active agents; gelatin, gum arabic, polyvinyl celluloses, alkanethiols and other polymer compounds. One of them or two or more of them in combination can be used.

Among them, the thiol having 8 or more carbon atoms is preferably used as the dispersing agent. Accordingly, the dispersing agent and the beta-ketoester function in a synergistic manner more effectively, thereby the metal particles are particularly highly dispersed. Moreover, by using the dispersion liquid to make a conductive film, for example, it is possible to surely prevent the dispersing agent and the beta-ketoester etc. from remaining in the conductive film. Therefore, the conductive film has particularly high conductivity. Examples of the thiol having 8 or more carbon atoms include: octanethiol (e.g. 1-octanethiol, 2-octanethiol), nonanethiol, decanethiol, undecanethiol, dodecanethiol, tridecanethiol, tetradecanethiol, pentadecanethiol and compounds obtained by introducing a substituent group (e.g. a halogen group or two or more mercapto groups) into molecules of any of the thiols. One of them or two or more of them in combination can be used. The thiol having 8 or more carbon atoms may have two or more mercapto groups in its molecule, for example.

While the average molecular weight of the thiol having 8 or more carbon atoms (hereinafter also simply referred to as the "thiol") is not particularly limited, it may range from 146 to 300 preferably, from 160 to 272 more preferably, and from 188 to 230 further preferably. If the average molecular weight of the thiol falls in the above-mentioned range, the metal particles are particularly highly dispersed. Moreover, by using the dispersion liquid to make a conductive film, for example, it is possible to surely prevent the thiol from remaining in the conductive film. Therefore, the conductive film has particularly high conductivity.

While the content of the thiol in the dispersion liquid is not particularly limited, its molar ratio relative to the atoms of the metal particles may range from 0.1 to 0.4 preferably, and from 0.2 to 0.3 more preferably. If the content of the thiol in the dispersion liquid falls in the above-mentioned range, the metal particles are particularly highly dispersed even if they account for a comparatively large portion of the metal particle dispersion liquid. Moreover, by using the dispersion liquid to make a conductive film, for example, it is possible to surely prevent the thiol etc. from remaining in the conductive film. Therefore, the conductive film has particularly high conductivity.

Furthermore, the mercapto-and-ester-group-containing compound described in the first embodiment and the heterocyclic compound described in the second embodiment may be used as the dispersing agent here. Accordingly, the above-described effects and the synergetic effects of using the dispersing agent and the beta-ketoester together can be achieved more effectively Beta-Ketoester While any beta-ketoester can be used here as long as it has a keto group in its beta position, it may preferably has a structure represented by Chemical Formula 9.

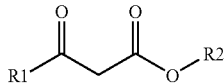

Chemical Formula 9

R1: Fluorine-substituted alkyl group.
R2: Straight chain, branched, or cyclic alkyl group having 1 to 8 carbon atoms.

With the beta-ketoester having this structure, the metal particles are particularly highly dispersed. Moreover, by using the dispersion liquid to make a conductive film, for example, it is possible to surely prevent the beta-ketoester etc. from remaining in the conductive film. Therefore, the conductive film has particularly high conductivity. It is also possible to produce the beta-ketoester easily with commercial reagents.

While the average molecular weight of the beta-ketoester is not particularly limited, it may range from 140 to 400 preferably, from 160 to 370 more preferably, and from 180 to 330 further preferably. If the average molecular weight of the beta-ketoester falls in the above-mentioned range, the metal particles are particularly highly dispersed. Furthermore, by using the dispersion liquid to make a conductive film, for example, it is possible to surely prevent the beta-ketoester etc. from remaining in the conductive film. Therefore, the conductive film has particularly high conductivity.

The content of the beta-ketoester, that is, its molar ratio relative to the metal atoms, ranges from 0.1 to 1.0 preferably, from 0.3 to 1.0 more preferably, and from 0.3 to 0.4 further preferably. Accordingly, the metal particles are particularly highly dispersed even if they account for a comparatively large portion of the metal particle dispersion liquid. Moreover, by using the dispersion liquid to make a conductive film, for example, it is possible to surely prevent the thiol and the beta-ketoester etc. from remaining in the conductive film. Therefore, the conductive film has particularly high conductivity.

Method for Manufacturing (Preparing) Metal Particle Dispersion Liquid

While the metal particle dispersion liquid may be manufactured (prepared) by any method, one method includes the following, for example: preparing a two-phase liquid including a precious metal salt to be metal particles, a sulfur-containing compound, a water polar liquid, a nonpolar liquid that is substantially insoluble to the water polar liquid, and a phase-transfer catalyst; adding a reducing agent to the two-phase liquid to make the metal particles covered by the sulfur-containing compound; separating a nonpolar liquid phase composed of the nonpolar liquid together with the metal particles; mixing the separated nonpolar liquid phase and an alcohol having 1 to 3 carbon atoms to make the metal particles precipitate; and dispersing the precipitating metal particles in a liquid functioning as a dispersion medium. To prepare the two-phase liquid, beta-ketoester can be used as needed. The method for manufacturing (preparing) the metal particle dispersion liquid will be described in greater detail below.

First Method

First, the metal salt of an element to be the metal particles is obtained by reducing the two-phase liquid composed of the water polar liquid (including the phase-transfer catalyst and the sulfur-containing compound) and the nonpolar liquid (substantially insoluble to the water polar liquid) with the reducing agent. Thus the metal particles protected by the sulfur-containing compound as a dispersing agent are formed. The reduction helped by the reducing agent is preferably carried out by agitating the two-phase liquid. Accordingly, the metal particles with a small variance in their diameters are formed.

The above-mentioned process can be carried out by mixing the two-phase liquid including the metal salt, and the reducing agent. Otherwise, it can be carried out by mixing the water polar liquid including the metal salt, and the nonpolar liquid including the reducing agent.

Examples of the metal salt include: silver nitrate, silver sulfate, silver chloride, silver oxide, silver acetate, silver nitrite, silver chlorate, silver sulfide and other silver salts; chlorauric acid, potassium chloroaurate, sodium chloroaurate and other gold salts; chloroplatinic acid, platinum chloride, platinum oxide, potassium platinum chloride and other platinum salts; palladium nitrate, palladium acetate, palladium chloride, palladium oxide, palladium sulfate and other palladium salts; and other types of precious metal salts. One of them or two or more of them in combination can be used.

Water or polar liquids soluble in water (e.g. a liquid with a solubility of 30 grams or more in 100-gram water at 25 degrees Celsius) can be used as the water polar liquid. Examples of such liquids include: water, methanol, ethanol and other alcohols, acetone and other ketones.

Any liquid that is substantially insoluble to the water polar liquid (e.g. a liquid with a solubility of 1 gram or less in 100-gram water at 25 degrees Celsius) can be used as the nonpolar liquid. Examples of such liquids include: methyl acetate, ethyl acetate, butyl acetate, ethyl formate and other esters; pentane, hexane, octane, tridecane and other aliphatic hydrocarbons (paraffinic hydrocarbons); cyclohexane, methylcyclohexane, tetralin, limonene and other alicyclic hydrocarbons; benzene, toluene, xylene, hexylbenzene, butylbenzene, octylbenzene, nonylbenzene, decylbenzene, undecylbenzene, dodecylbenzene, tridecylbenzene, tetradecylbenzen and other benzenes having a long-chain alkyl group (alkylbenzene derivatives); tetralin and other aromatic hydrocarbons; methylene chloride, chloroform, carbon tetrachloride, 1,2-dichloroethane and other halogenated hydrocarbons. One of them or two or more of them in combination can be used.

Examples of the reducing agent include: dimethylaminoethanol, methyldiethanolamine, triethanolamine, phenidone, hydrazine and other amine compounds; sodium borohydroxide, hydrogen iodide, hydrogen gas and other hydrogen compounds; carbon monoxide, sulfurous acid and other oxides; ferrous sulfate, iron chloride, iron fumarate, iron lactate, iron oxalate, iron sulfide, tin acetate, tin chloride, tin diphosphate, tin oxalate, tin oxide, tin sulfate and other low-valent metal salts; formaldehyde, hydroquinone, pyrogallol, tannin, tannic acid, salicylic acid, D-glucose and other sugars and other organic compounds. One of them or two or more of them in combination can be used. When any of the reducing agents is used, the reduction reaction may be promoted with light or heat.

Subsequently, the nonpolar liquid phase in which the metal particles protected by the dispersing agent (sulfur-containing compound) is separated. Then the alcohol having 1 to 3 carbon atoms is added to the separated nonpolar liquid phase so as to lower the dispersion of the metal particles and make the metal particles protected by the dispersing agent precipitate. If necessary, the precipitating particles may be brought out and cleaned with the alcohol again to remove unnecessary residues of the reducing agent and the phase-transfer catalyst. Cleaning may be carried out for multiple times. The metal particles thus produced have a small variance in their diameters and few impurities.

Examples of the alcohol having 1 to 3 carbon atoms include methanol, ethanol, and propanol (n-propanol, isopropanol).

Then, the precipitating metal particles are dispersed in a liquid functioning as the dispersion medium, which completes the metal particle dispersion liquid.

Second Method

Here is another method for manufacturing the metal particle dispersion liquid.

First, the metal salt of an element to be the metal particles, a liquid containing the alcohol having 1 to 3 carbon atoms, and the sulfur-containing compound are mixed. Next, the reducing agent is added to this reaction liquid and the liquid is then agitated.

The reaction liquid is left for a certain period of time to make the metal particles precipitate. The period is not particularly limited, and may be 5 minutes to 20 hours, for example.

Subsequently, the precipitating metal particles are dispersed in a liquid functioning as the dispersion medium, which completes the metal particle dispersion liquid.

The above-described methods easily and surely provide the metal particle dispersion liquid in which the metal particles are highly dispersed. Furthermore, it is possible to easily and surely manufacture the metal particle dispersion liquid that can be desirably applied to making of a conductive film, such as metal wiring.

The metal particle dispersion liquid can be used for any purpose. For example, it can be applied to making of ornaments (forming of ornamental patterns) and of conductive films (forming of wiring patterns). A method for making a conductive film and a conductive film made by the method according to a still another embodiment will now be described.

Conductive Film and Method for Making Conductive Film

A conductive film according to the present embodiment is manufactured by using the above-described metal particle dispersion liquid.

Specifically, the conductive film is manufactured as follows, for example.

First, the metal particle dispersion liquid is deposited on a substrate on which the conductive film will be provided.

Examples of methods for depositing the metal particle dispersion liquid (film-forming methods) may include, but not be limited to, spin coating, dip coating, spray coating, roll coating, screen printing and droplet discharge methods (e.g. inkjet printing). Among them, the droplet discharge methods are preferably used, since they can provide a film having a minute pattern easily and accurately.

Substantially, the dispersion medium and the dispersing agent that covers and protects the surface of the metal particles are removed from the film that has provided in a predetermined shape, which completes the conductive film.

While any method can be used here to remove the dispersion medium and the dispersing agent, heating (burning) is preferably carried out for this purpose. Accordingly, interparticle bonding (diffusion) proceeds, thereby the conductive film has particularly high conductivity and reliability.

While the heating temperature is not particularly limited, it may be 300 degrees Celsius or lower preferably, 200 degrees Celsius or lower more preferably, and 150 degrees Celsius or lower further preferably.

In addition to the heating, ultraviolet radiation is preferably carried out. Accordingly, the dispersing agent (e.g. the sulfur-containing compound) is efficiently removed at comparatively low temperatures, thereby providing the conductive film in which interparticle bonding (diffusion) has proceeded sufficiently. The conductive film thus produced has particularly high conductivity.

While the heating temperature when the ultraviolet radiation is carried out is not particularly limited, it may be 250 degrees Celsius or lower preferably, from 100 to 200 degrees Celsius more preferably, and from 120 to 180 degrees Celsius further preferably.

While heating methods when the ultraviolet radiation is carried out are not particularly limited, infrared radiation may be used preferably. Accordingly, the film can be selectively heated, while the substrate is prevented from being heated.

While any ultraviolet rays can be used here as long as they have 400-nm or less wavelength components, they may mainly have 1- to 380-nm wavelength components preferably. Consequently, the ultraviolet radiation can exhibit the above-described effects more markedly. In particular, when the mercapto-and-ester-group-containing compound described in the first embodiment or the heterocyclic compound described in the second embodiment is used as the sulfur-containing compound, or the beta-ketoester described in the fourth embodiment is used together with the dispersing agent (sulfur-containing compound), the ultraviolet rays may mainly have 180- to 360-nm wavelength components preferably, and 240- to 260-nm wavelength components more preferably. When the thiol having 8 to 18 carbon atoms described in the third embodiment is used as the sulfur-containing compound, the ultraviolet rays may mainly have 30- to 360-nm wavelength components preferably, and 60- to 260-nm wavelength components more preferably. Consequently, the ultraviolet radiation can exhibit the above-described effects more markedly.

While the radiation intensity of the ultraviolet rays is not particularly limited, it may be 0.5 mW/cm$^2$ or higher preferably, 2.0 mW/cm² or higher more preferably, and 10.0 mW/cm² or higher further preferably.

While the radiation time of the ultraviolet rays is not particularly limited, it may range from 1 second to 5 hours preferably.

The radiation of the ultraviolet rays and the heating may be carried out either simultaneously or non-simultaneously (the radiation may be carried out before or after the heating).

The conductive film thus produced has particularly high conductivity.

In this case, the conductive film has an electrical resistance (resistivity) of 10 μΩcm or less preferably, and of 5 μΩcm or less more preferably.

Electronic Device

An electronic device according to yet another embodiment of the invention will now be described. The electronic device has the above-described conductive film and is applied to an active-matrix transmissive liquid crystal display (LCD), for example.

FIG. 1 is an exploded perspective view showing the electronic device according to the present embodiment of the invention that is applied to a transmissive LCD.

In FIG. 1, part of the members of the display is omitted to simplify the description. The upper side of the drawing is hereinafter referred to as the "top" and the lower side of the drawing as the "bottom".

Referring to FIG. 1, this transmissive LCD (hereinafter simply referred to as the "LCD") 100 includes a liquid crystal panel (display panel) 200 and a backlight (light source) 600.

The LCD 100 displays images (information) by transmitting light from the backlight 600 to the liquid crystal panel 200.

The liquid crystal panel 200 includes a first substrate 220 and a second substrate 230 that are placed face to face with each other. Provided between the first substrate 220 and the second substrate 230 is a sealing material (not shown) that surrounds a display area.

Between the first substrate 220 and the second substrate 230, a liquid crystal layer 240 is interposed.

Both of the first substrate 220 and the second substrate 230 are made of a glass material, for example.

The first substrate 220 is provided on its top surface 221 (on the liquid crystal layer 240 side) with a plurality of pixel electrodes 223 arranged in a matrix and a signal electrode 224 extending in the X direction. Each of the pixel electrodes 223 in a column are coupled to one signal electrode 224 via a switching element 222.

The switching element 222 is a thin-film diode (TFD) or a thin-film transistor (TFT), for example.

For example, if the switching element 222 is a TFD, a metal layer 229 is provided on an extraction part 228 extracted from the signal electrode 224 with an insulating film therebetween. Thus the metal layer 229 is coupled to the pixel electrodes 223. Since the switching element 222 has a metal-insulator-metal sandwich structure, it has diode switching characteristics in the positive and negative directions.

The signal electrode 224 and the extraction part 228 include any of the above-described conductive films.

Provided on the bottom surface of the first substrate 220 is a polarizing plate 225.

The second substrate 230 is provided on its bottom surface 231 (on the liquid crystal layer 240 side) with a plurality of strip scanning electrodes 232. The scanning electrodes 232 are arranged almost in parallel with each other at predetermined intervals along the Y direction, which is almost orthogonal to the signal electrode 224. Also, the scanning electrodes 232 are arranged to be opposed to the pixel electrodes 223.

Each overlapping area of the pixel electrodes 223 and the scanning electrodes 232 (and its peripheral area) functions as a pixel. Charge and discharge between the electrodes drive the liquid crystal of the liquid crystal layer 240, that is to say, change the orientation of the liquid crystal.

Provided on the bottom surface of the scanning electrodes 232 are red (R), green (G) and blue (B) color layers (color filters) 233. The color filters 232 are partitioned by a black matrix 234.

Provided on the top surface of the second substrate 230 is another polarizing plate 235 whose polarizing axis differs from that of the polarizing plate 225.

With this liquid crystal panel 200, light from the backlight 600 is polarized by the polarizing plate 225 and enters the liquid crystal layer 240 through the first substrate 220 and each of the pixel electrodes 223. The intensity of the light that has entered the liquid crystal layer 240 is modulated by the liquid crystal whose orientation is controlled for each pixel. Subsequently, the light passes through the color layers 233, the scanning electrodes 232 and the second substrate 230. The light is then polarized by the polarizing plate 235 and exits to the outside. Accordingly, both moving and still colored images, such as characters, figures and graphics, are viewed with the LCD 100 from the side of the second substrate 230 opposite to the liquid crystal layer 240 side.

The LCD 100 can be used as displays included in various electronic apparatuses.

Note that the electronic device according to the present embodiment is applicable not only to the LCD described above, but also to organic and inorganic electroluminescent devices, organic or inorganic TFTs, electrophoretic displays and noncontact integrated circuit cards, for example. This means that the above-described conductive films are applicable to electrodes and wiring included in these electronic devices.

Electronic Apparatus

Electronic apparatuses including the above-mentioned electronic device (LCD) will now be described.

Figure 2:
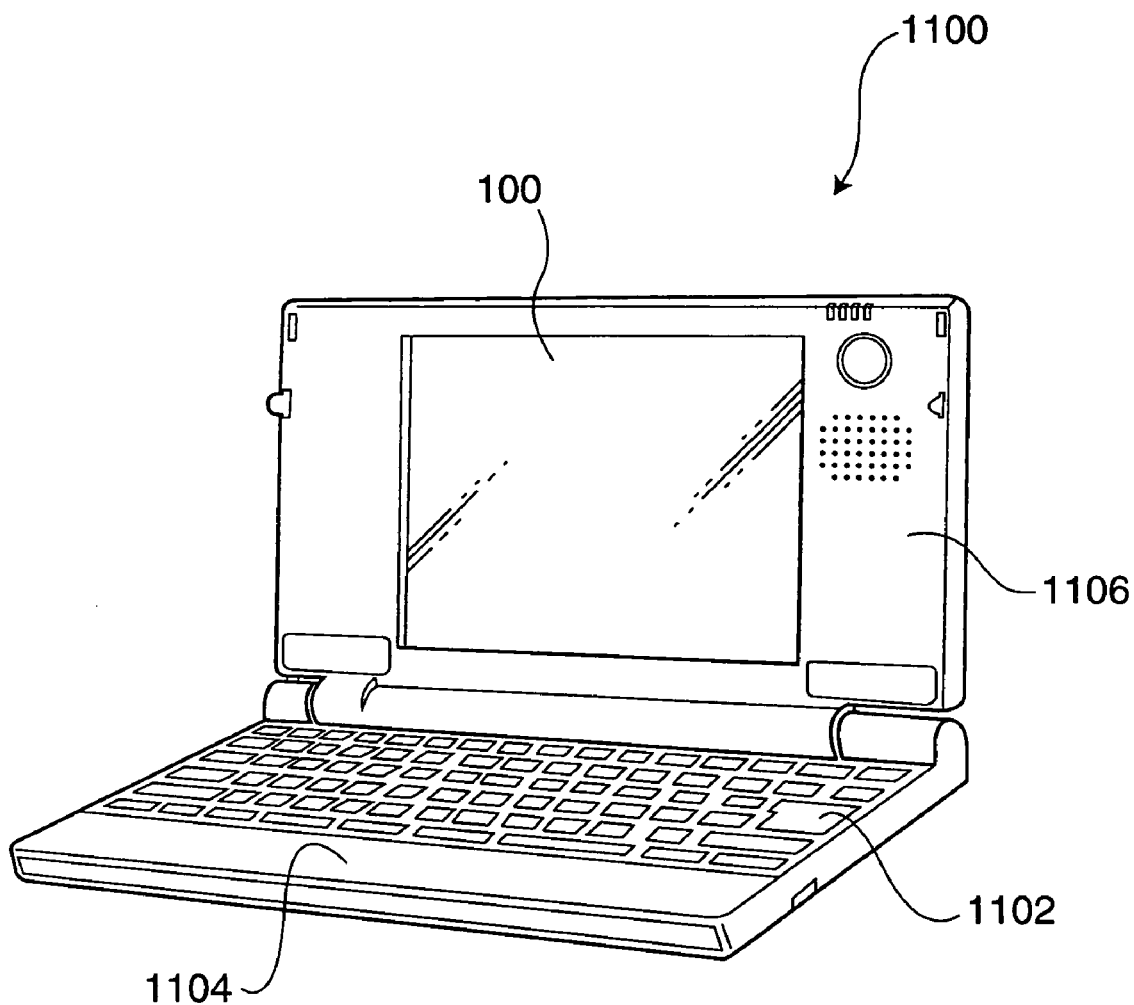
FIG. 2 is a perspective view showing an electronic apparatus according to one embodiment of the invention that is applied to a mobile (or notebook) personal computer.

FIG. 2 is a perspective view showing an electronic apparatus according to another embodiment of the invention that is applied to a mobile (or notebook) personal computer.

Referring to this drawing, this personal computer 1100 includes a body 1104 having a keyboard 1102, and a display unit 1106. The display unit 1106 is supported rotatably to the body 1104 with a hinge structure.

In the personal computer 1100, the display unit 1106 includes the LCD 100 (electrooptical device).

Figure 3:
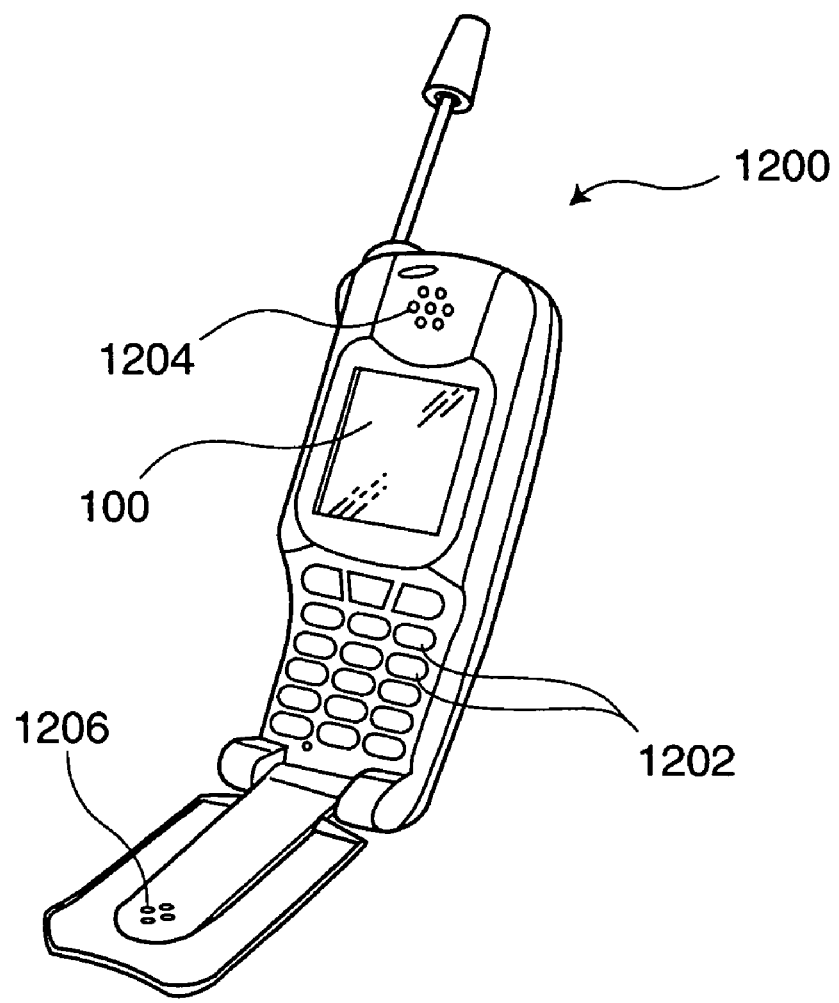
FIG. 3 is a perspective view showing an electronic apparatus according to one embodiment of the invention that is applied to a cellular phone or personal handyphone system.

FIG. 3 is a perspective view showing an electronic apparatus according to a yet another embodiment of the invention that is applied to a cellular phone or personal handyphone system.

Referring to this drawing, this cellular phone 1200 includes the LCD 100 (electrooptical device), a plurality of operation buttons 1202, an earpiece 1204 and a mouthpiece 1206.

Figure 4:
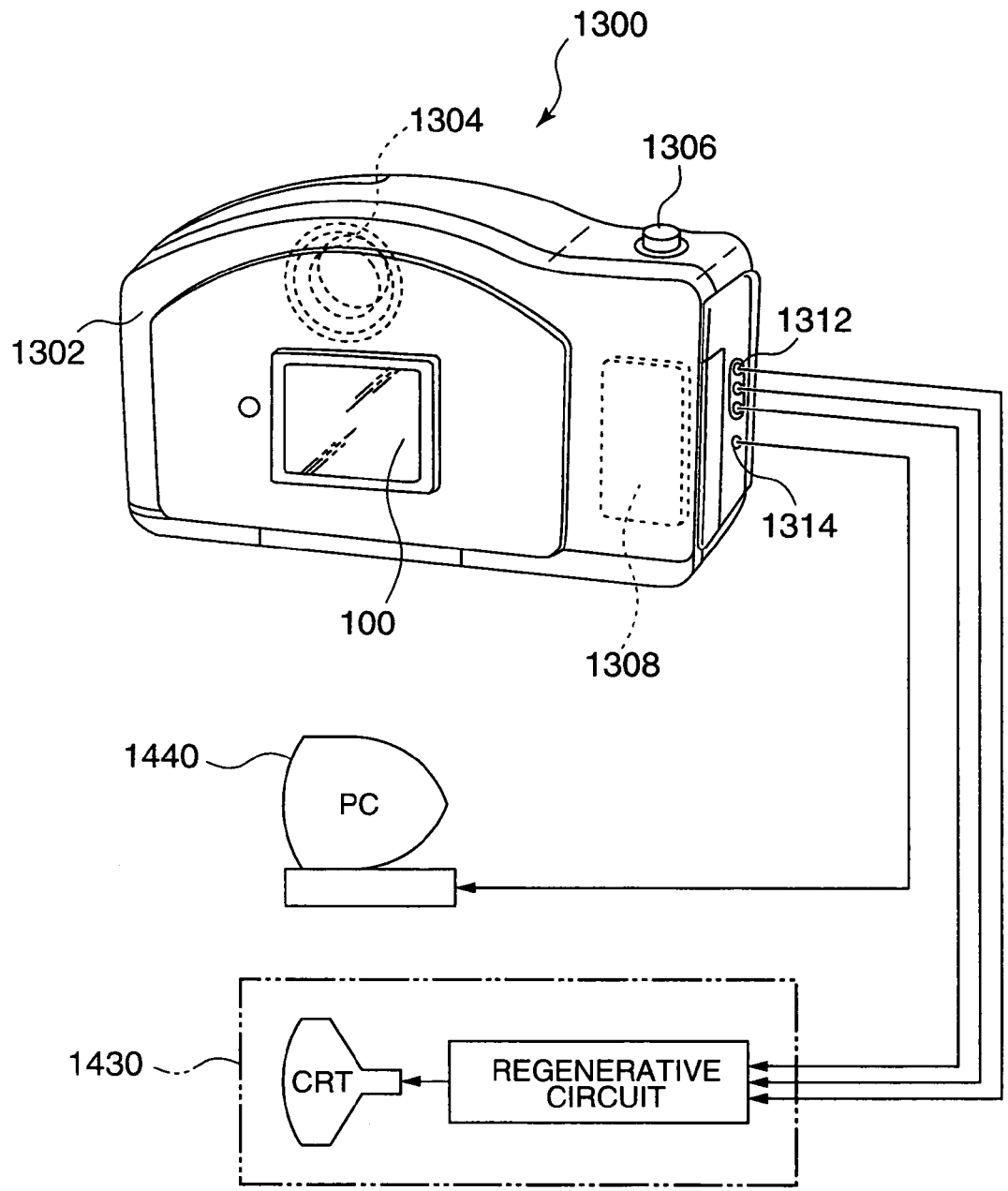
FIG. 4 is a perspective view showing an electronic apparatus according to one embodiment of the invention that is applied to a digital still camera.

FIG. 4 is a perspective view showing an electronic apparatus according to a still another embodiment of the invention that is applied to a digital still camera. This drawing also simply shows coupling to external apparatuses.

This digital still camera 1300 includes a case (body) 1302 and the LCD 100 as a display on the back side of the case 1302. The LCD 100 functions as a finder to display a photographic subject as an electronic image by providing a display based on an imaging signal from a charge-coupled device (CCD).

Provided inside the case is a circuit board 1308. The circuit board 1308 has a memory that is capable of storing the imaging signal.

The camera also includes a light-receiving unit 1304 including an optical lens (imaging optical system) and the CCD on the front side (on the back side of the drawing) of the case 1302.

When a photographer views an image of a photographic subject displayed on the LCD 100 and presses a shutter button 1306, the imaging signal in the CCD at the moment is transferred to and stored in the memory of the circuit board 1308.

The digital still camera 1300 also includes a video signal output terminal 1312 and an input/output terminal 1314 for data communications on the side of the case 1302. As shown in the drawing, the video signal output terminal 1312 is coupled to a television monitor 1430, and the input/output terminal 1314 is coupled to a personal computer 1440, when required. In this case, the imaging signal stored in the memory of the circuit board 1308 is output to the television monitor 1430 or the personal computer 1440 by a predetermined process.

Examples of electronic apparatuses to which the invention is applied, other than the (mobile) personal computer shown in FIG. 2, the cellular phone shown in FIG. 3 and the digital still camera shown in FIG. 4, include: television sets, video cameras, viewfinder or monitor-viewing video tape recorders, laptop personal computers, car navigation systems, pagers, electronic notebooks (including electronic notebooks with communication functions), electronic dictionaries, calculators, electronic game machines, word processors, workstations, videophones, security monitors, electronic binoculars, point-of-sales terminals, touch-panel devices (e.g. automatic teller machines of financial institutions, automatic ticket machines), medical instruments (e.g. electronic thermometers, sphygmomanometers, blood sugar meters, electrocardiogram displays, ultrasonic diagnosis devices, endoscope displays), fish detectors, measuring instruments and gauges (e.g. vehicle, airplane, and marine gauges), flight simulators, monitors, projectors and other projection displays.

While the preferred embodiments of the invention have been described, they are not intended to limit the invention.

For example, the method for manufacturing the metal particle dispersion liquid may include one or more steps for any purpose.

Furthermore, the metal particle dispersion liquid may be manufactured by other methods than any of the above-described methods. For example, while the metal salt is obtained by the reduction reaction with the reducing agent in the above-described embodiments, the reaction may be achieved with ultraviolet rays, electron beams or thermal energy.

Furthermore, the electronic device and apparatus according to any of the above-described embodiments may include any substitute that has the same function as its original member and may include any additional member.

Working Examples

A specific working example according to the invention will now be described.

Method for Manufacturing Silver Dispersion Liquid (Metal Particle Dispersion Liquid)

Sample No. I-1

A solution (mercapto-and-ester-group-containing compound solution) was prepared by dissolving 1.23-gram n-octylthioglycolate (mercapto-and-ester-group-containing compound) in 100-ml toluene.

Separately, 1.02-gram silver nitrate monohydrate (metal salt) was dissolved in 20-ml water and was then mixed with another solution in which 14.6-gram tetraoctylammonium bromide (phase-transfer catalyst) was dissolved in 270-ml toluene. The mixture was agitated for 30 minutes at room temperature. The mercapto-and-ester-group-containing compound solution was added to the mixture and then agitated for another 30 minutes to obtain a toluene/water two-phase liquid.

Subsequently, another solution was prepared by dissolving 2.28-gram borohydride sodium (reducing agent) in 140-ml water. This solution was dropped in the toluene/water two-phase liquid that had been well agitated. The liquid was further agitated for three hours at room temperature to obtain a dispersion liquid in which silver particles were dispersed. The liquid was then left for a certain period of time to separate a toluene phase and a water phase. It was observed that the silver particles were in the toluene phase, while the water phase was clear and colorless. After the water phase was separated and removed, 740-ml ethanol was added to the toluene phase to make the silver particles precipitate. The precipitating silver particles were made to thoroughly settle down with a centrifugal machine. Then toluene was removed to obtain the silver particles. Subsequently, the silver particles were dispersed in tetralin to obtain a silver dispersion liquid (metal particle dispersion liquid) with a silver concentration of 30 wt %. The diameter of the silver particles in the silver dispersion liquid was measured to be 3.0 nm by dynamic scattering (HPPS by Malvern). Transmission electron microscope (TEM) observation confirmed that crystalline first particles had been formed.

Sample No. I-2

A silver dispersion liquid was prepared in the same manner as Sample No. I-1, except for using limonene instead of tetralin to disperse silver particles.

Sample No. I-3

A silver dispersion liquid was prepared in the same manner as Sample No. I-1, except for using alpha-terpineol instead of tetralin to disperse silver particles.

Sample Nos. I-4, I-5, I-6

Silver dispersion liquids were prepared with Sample Nos. I-4, I-5 and I-6 in the same manner as Sample Nos. I-1, I-2 and I-3, respectively, except for using 0.81-gram 3-mercaptopropionic acid ethyl instead of n-octylthioglycolate as the mercapto-and-ester-group-containing compound.

Sample Nos. I-7, I-8, I-9

Silver dispersion liquids were prepared with Sample Nos. I-7, I-8 and I-9 in the same manner as Sample Nos. I-1, I-2 and I-3, respectively, except for using 1.57-gram 6-mercapto caproate n-octyl instead of n-octylthioglycolate as the mercapto-and-ester-group-containing compound.

Sample Nos. I-10, I-11, I-12

Silver dispersion liquids were prepared with Sample Nos. I-10, I-11 and I-12 in the same manner as Sample Nos. I-1, I-2 and I-3, respectively, except for using 1.82-gram 8-mercapto caprylate n-nonyl instead of n-octylthioglycolate as the mercapto-and-ester-group-containing compound.

Sample No. I-13

A silver dispersion liquid was prepared in the same manner as Sample No. I-1, except for using 1.37-gram caproate n-octyl instead of n-octylthioglycolate. In this case, since silver particles coagulated and no dispersion liquid was available.

Sample No. I-14

A silver dispersion liquid was prepared in the same manner as Sample No. I-1, except for using 1.06-gram 8-mercapto caprylate instead of n-octylthioglycolate.

Sample No. I-15

A silver dispersion liquid was prepared in the same manner as Sample No. I-1, except for using 1.22-gram 1-dodecanethiol instead of n-octylthioglycolate.

TEM photo data revealed particle size distribution for each of the samples. The average diameter and peak half width in the size distribution were measured. Table 1 shows the conditions and measurement for each sample silver dispersion liquid.

TABLE 1

| Sample No. | Dispersion medium | Ag particle | | | Dispersing agent | | |
|---|---|---|---|---|---|---|---|
| | | Content [wt %] | Ave. dia [nm] | Half width [nm] | Material | Molecular weight | Content [Molar ratio to Ag] |
| I-1 (Invention) | Tetralin | 30 | 3 | 0.5 | n-octylthioglycolate | 204 | 1 |
| I-2 (Invention) | Limonene | 30 | 3.2 | 0.5 | n-octylthioglycolate | 204 | 1 |
| I-3 (Invention) | Alpha-terpineol | 30 | 3.1 | 0.5 | n-octylthioglycolate | 204 | 1 |
| I-4 (Invention) | Tetralin | 30 | 2.5 | 0.5 | 3-mercaptopropionic acid ethyl | 134 | 1 |
| I-5 (Invention) | Limonene | 30 | 2.8 | 0.5 | 3-mercaptopropionic acid ethyl | 134 | 1 |
| I-6 (Invention) | Alpha-terpineol | 30 | 2.6 | 0.5 | 3-mercaptopropionic acid ethyl | 134 | 1 |
| I-7 (Invention) | Tetralin | 10 | 10 | 2 | 6-mercapto caproate n-octyl | 260 | 1 |
| I-8 (Invention) | Limonene | 10 | 13 | 2 | 6-mercapto caproate n-octyl | 260 | 1 |
| I-9 (Invention) | Alpha-terpineol | 10 | 12 | 2 | 6-mercapto caproate n-octyl | 260 | 1 |
| I-10 (Invention) | Tetralin | 5 | 25 | 5 | 8-mercapto caprylate n-nonyl | 302 | 1 |
| I-11 (Invention) | Limonene | 5 | 30 | 5 | 8-mercapto caprylate n-nonyl | 302 | 1 |
| I-12 (Invention) | Alpha-terpineol | 5 | 28 | 5 | 8-mercapto caprylate n-nonyl | 302 | 1 |
| I-13 (Comparative) | Tetralin | — | — | — | caproate n-octyl | 228 | 1 |
| I-14 (Comparative) | Tetralin | 10 | 15 | 3 | 8-mercapto caprylate | 176 | 1 |
| I-15 (Comparative) | Tetralin | 30 | 5 | 0.5 | 1-dodecanethiol | 202 | 1 |

As Table 1 shows, the metal particle dispersion liquids of the samples according to the invention has a small variance in particle diameters and sharp size distribution.

Dispersion Liquid Stability

The samples were left at 20 degrees Celsius for three days. They was then classified into the following four classes based on their state of silver particle dispersion.

A: A highly dispersed state of the metal particles as a dispersed substance was maintained.

B: No silver particle precipitation was observed, but there was some unevenness seemingly attributed to a variance in silver particle diameters in the dispersion liquid.

C: Some silver particle precipitation was observed.

D: Significant silver particle precipitation was observed.

Table 2 shows the classification results.

TABLE 2

| Sample No. | Dispersion liquid stability |
|---|---|
| I-1 (Invention) | A |
| I-2 (Invention) | A |
| I-3 (Invention) | A |
| I-4 (Invention) | A |
| I-5 (Invention) | A |
| I-6 (Invention) | A |
| I-7 (Invention) | B |
| I-8 (Invention) | B |

TABLE 2-continued

| Sample No. | Dispersion liquid stability |
|---|---|
| I-9 (Invention) | B |
| I-10 (Invention) | C |
| I-11 (Invention) | C |
| I-12 (Invention) | C |
| I-13 (Comparative) | D |
| I-14 (Comparative) | D |
| I-15 (Comparative) | A |

As Table 2 shows, the metal particle dispersion liquids of the samples according to the invention has high dispersion stability of the metal particles.

Making of Wiring (Conductive Film)

Sample No. II-1

The silver dispersion liquid of Sample No. I-1 was discharged on a glass substrate in a line pattern with an inkjet device and dried at 100 degrees Celsius to form a film. The same process was repeated to provide another film on top of the film that had been formed.

Subsequently, the resultant film was burned at 150 degrees Celsius for 60 minutes to provide wiring (conductive film) to a line width of 50 μm and a thickness of 1 μm. This burning was carried out by ultraviolet radiation with a wavelength of 254 nm and a radiation intensity of 10 mW/cm$^2$.

Sample Nos. II-2 to II-15

Wiring (conductive films) was provided in the same manner as Sample No. II-1, except for using the silver dispersion liquids of Sample Nos. I-2 to I-15 instead of the silver dispersion liquid of Sample No. I-1.

Sample Nos. III-1 to III-15

Wiring (conductive films) was provided in the same manner as Sample Nos. II-1 to II-15, except for burning was carried out at 250 degrees Celsius for 10 minutes.

Evaluation of Wiring (Conductive Film)

For each wiring (conductive films) of Sample Nos. II-1 to II-15 and Nos. III-1 to III-15, electrical resistance (resistivity) was measured.

Table 3 shows the measurement results.

TABLE 3

| UV (254 nm, 10 mW/cm$^2$), burning at 150 degrees C. for 60 min. | Electrical resistance (μΩcm) | UV (254 nm, 10 mW/cm$^2$), burning at 250 degrees C. for 10 min. | Electrical resistance (μΩcm) |
|---|---|---|---|
| II-1 (Invention) | 90 | III-1 (Invention) | 7 |
| II-2 (Invention) | 100 | III-2 (Invention) | 8 |
| II-3 (Invention) | 80 | III-3 (Invention) | 6 |
| II-4 (Invention) | 100 | III-4 (Invention) | 8 |
| II-5 (Invention) | 110 | III-5 (Invention) | 9 |
| II-6 (Invention) | 90 | III-6 (Invention) | 7 |
| II-7 (Invention) | 300 | III-7 (Invention) | 15 |
| II-8 (Invention) | 350 | III-8 (Invention) | 18 |
| II-9 (Invention) | 280 | III-9 (Invention) | 13 |
| II-10 (Invention) | 650 | III-10 (Invention) | 30 |
| II-11 (Invention) | 800 | III-11 (Invention) | 40 |
| II-12 (Invention) | 570 | III-12 (Invention) | 35 |
| II-13 (Comparative) | — | III-13 (Comparative) | — |
| II-14 (Comparative) | — | III-14 (Comparative) | 120 |
| II-15 (Comparative) | — | III-15 (Comparative) | 85 |

As Table 2 shows, the wiring (conductive films) of the samples according to the invention has low electrical resistance. Furthermore, it is possible to provide wiring by burning at lower temperatures than the comparative samples.

Since no dispersion liquid was available with the comparative sample I-13, no evaluation was made with Sample Nos. II-13 and III-13. This was because they included no thiol functioning as a dispersing agent.

As for the comparative samples II-14 and II-15, no measurement data were available, since no electrical conduction occurred. As for the comparative samples III-14 and III-15, which involved burning at the higher temperature, electrical conduction occurred but electrical resistance was larger than the samples according to the invention. This was because the comparative samples I-14 and I-15 has no ester group, thereby ultraviolet radiation to provide wiring (conductive films) had no effects.

The wiring (conductive films) of Sample Nos. III-1 to III-12 were used to manufacture electronic devices and apparatuses as shown in FIGS. 1 through 4. Accordingly, it was confirmed that efficient and reliable electronic devices and apparatuses were manufactured.

The above-mentioned results were also available when the same evaluation was carried out with metal particle dispersion liquids that had been prepared in the same manner as described above except for using gold particles or Ag—Pd alloy particles as metal particles.

Another specific working example according to the invention will now be described.

Method for Manufacturing Silver Dispersion Liquid (Metal Particle Dispersion Liquid)

Sample No. IV-1

A solution (heterocyclic compound solution) was prepared by dissolving 0.72-gram 2-mercapto-5-methyl-1,3,4-thiadiazole (heterocyclic compound) shown by Chemical Formula 10 below in 100-ml toluene.

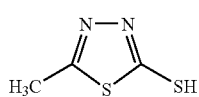

Chemical Formula 10

Separately, 1.02-gram silver nitrate monohydrate (metal salt) was dissolved in 20-ml water and was then mixed with another solution in which 14.6-gram tetraoctylammonium bromide (phase-transfer catalyst) was dissolved in 270-ml toluene. The mixture was agitated for 30 minutes at room temperature. The heterocyclic compound solution was added to the mixture and then agitated for another 30 minutes to obtain a toluene/water two-phase liquid.

Subsequently, another solution was prepared by dissolving 2.28-gram borohydride sodium (reducing agent) in 140-ml water. This solution was dropped in the toluene/water two-phase liquid that had been well agitated. The liquid was further agitated for three hours at room temperature to obtain a dispersion liquid in which silver particles were dispersed. The liquid was then left for a certain period of time to separate a toluene phase and a water phase. It was observed that the silver particles were in the toluene phase, while the water phase was clear and colorless. After the water phase was separated and removed, 740-ml ethanol was added to the toluene phase to make the silver particles precipitate. The precipitating silver particles were made to thoroughly settle down with a centrifugal machine. Then toluene was removed to obtain the silver particles. Subsequently, the silver particles were dispersed in toluene to obtain a silver dispersion liquid (metal particle dispersion liquid) with a silver concentration of 10 wt %. The diameter of the silver particles in the silver dispersion liquid was measured to be 5.0 nm by dynamic scattering (HPPS by Malvern). Transmission electron microscope (TEM) observation confirmed that crystalline first particles had been formed.

Sample Nos. IV-2, IV-3

Silver dispersion liquids were prepared in the same manner as Sample No. IV-1, except for changing the contents of 2-mercapto-5-methyl-1,3,4-thiadiazole in the silver dispersion liquid as shown in Table 4.

Sample No. IV-4

A silver dispersion liquid was prepared in the same manner as Sample No. IV-1, except for using 0.65-gram 2-mercaptothiazole shown by Chemical Formula 11 below instead of 2-mercapto-5-methyl-1,3,4-thiadiazole as the heterocyclic compound.

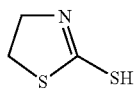

Chemical Formula 11

Sample No. IV-5

A silver dispersion liquid was prepared in the same manner as Sample No. IV-1, except for using 0.55-gram 5-mercapto-1,2,3-triazole shown by Chemical Formula 12 below instead of 2-mercapto-5-methyl-1,3,4-thiadiazole as the heterocyclic compound.

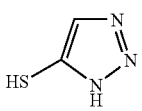

Chemical Formula 12

Sample No. IV-6

A silver dispersion liquid was prepared in the same manner as Sample No. IV-1, except for using no heterocyclic compound (dispersing agent). In this case, since silver particles coagulated when the reducing agent was added and no dispersion liquid was available.

Sample No. IV-7

A silver dispersion liquid was prepared in the same manner as Sample No. IV-1, except for using 1.1-gram 1-dodecanethiol instead of 2-mercapto-5-methyl-1,3,4-thiadiazole.

Sample No. IV-8

A silver dispersion liquid was prepared in the same manner as Sample No. IV-1, except for using 0.52-gram 2,5-dimethylfuran instead of 2-mercapto-5-methyl-1,3,4-thiadiazole. In this case, since silver particles coagulated when the reducing agent was added and no dispersion liquid was available.

TEM photo data revealed particle size distribution for each of the samples. The average diameter and peak half width in the size distribution were measured. Table 4 shows the conditions and measurement for each sample silver dispersion liquid.

TABLE 4

| Sample No. | Dispersion medium | Ag particle | | | Dispersing agent | | |
|---|---|---|---|---|---|---|---|
| | | Content [wt %] | Ave. dia [nm] | Half width [nm] | Material | Molecular weight | Content [Molar ratio to Ag] |
| IV-1 (Invention) | Toluene | 10 | 5 | 1 | 2-mercapto-5-methyl-1,3,4-thiadiazole | 132 | 1 |
| IV-2 (Invention) | Toluene | 10 | 7 | 2 | 2-mercapto-5-methyl-1,3,4-thiadiazole | 132 | 0.1 |
| IV-3 (Invention) | Toluene | 10 | 4.5 | 1 | 2-mercapto-5-methyl-1,3,4-thiadiazole | 132 | 2 |
| IV-4 (Invention) | Toluene | 10 | 5.5 | 1 | 2-mercaptothiazole | 119 | 1 |
| IV-5 (Invention) | Toluene | 10 | 8 | 3 | 5-mercapto-1,2,3-triazole | 101 | 1 |
| IV-6 (Comparative) | — | — | — | — | — | — | — |
| IV-7 (Comparative) | Toluene | 10 | 6 | 1 | 1-dodecanethiol | 202 | 1 |
| IV-8 (Comparative) | — | — | — | — | 2,5-dimethylfuran | 96 | 1 |

As Table 4 shows, the metal particle dispersion liquids of the samples according to the invention has a small variance in particle diameters and sharp size distribution.

Dispersion Liquid Stability

The samples were left at 20 degrees Celsius for three days. They was then classified into the following four classes based on their state of silver particle dispersion.

A: A highly dispersed state of the metal particles as a dispersed substance was maintained.

B: No silver particle precipitation was observed, but there was some unevenness seemingly attributed to a variance in silver particle diameters in the dispersion liquid.

C: Some silver particle precipitation was observed.

D: Significant silver particle precipitation was observed.

Table 5 shows the classification results.

TABLE 5

| Sample No. | Dispersion liquid stability |
|---|---|
| IV-1 (Invention) | A |
| IV-2 (Invention) | C |
| IV-3 (Invention) | B |
| IV-4 (Invention) | A |
| IV-5 (Invention) | B |
| IV-6 (Comparative) | D |
| IV-7 (Comparative) | A |
| IV-8 (Comparative) | D |

As Table 5 shows, the metal particle dispersion liquids of the samples according to the invention has high dispersion stability of the metal particles.

Making of Wiring (Conductive Film)

Sample No. V-1

The silver dispersion liquid of Sample No. IV-1 was discharged on a glass substrate in a line pattern with an inkjet device and dried at 110 degrees Celsius to form a film. The same process was repeated to provide another film on top of the film that had been formed.

Subsequently, the resultant film was burned at 150 degrees Celsius for 60 minutes to provide wiring (conductive film) to a line width of 50 µm and a thickness of 1 µm. This burning was carried out by ultraviolet radiation with a wavelength of 254 nm and a radiation intensity of 10 mW/cm$^2$.

Sample Nos. V-2 to V-8

Wiring (conductive films) was provided in the same manner as Sample No. V-1, except for using the silver dispersion liquids of Sample Nos. IV-2 to IV-8 instead of the silver dispersion liquid of Sample No. IV-1.

Sample Nos. VI-1 to VI-8

Wiring (conductive films) was provided in the same manner as Sample Nos. V-1 to V-8, except for burning was carried out at 250 degrees Celsius for 10 minutes.

Evaluation of Wiring (Conductive Film)

For each wiring (conductive films) of Sample Nos. V-1 to V-8 and Nos. VI-1 to VI-8, electrical resistance (resistivity) was measured.

Table 6 shows the measurement results.

TABLE 6

| Burning at 150 degrees C. for 60 min. | Electrical resistance (µΩcm) | Burning at 250 degrees C. for 10 min. | Electrical resistance (µΩcm) |
|---|---|---|---|
| V-1 (Invention) | 100 | VI-1 (Invention) | 8 |
| V-2 (Invention) | 120 | VI-2 (Invention) | 10 |
| V-3 (Invention) | 250 | VI-3 (Invention) | 20 |
| V-4 (Invention) | 90 | VI-4 (Invention) | 8 |
| V-5 (Invention) | 380 | VI-5 (Invention) | 18 |
| V-6 (Comparative) | — | VI-6 (Comparative) | — |
| V-7 (Comparative) | — | VI-7 (Comparative) | 85 |
| V-8 (Comparative) | — | VI-8 (Comparative) | — |

Not experimented with Sample Nos. V-6, V-8, VI-6 and VI-8, since the dispersion liquid was not available with these samples.
No measurement data available with Sample No. V-7, since no electrical resistance occurred under the above burning conditions.

As Table 6 shows, the wiring (conductive films) of the samples according to the invention has low electrical resistance. Furthermore, it is possible to provide wiring by burning at lower temperatures than the comparative samples.

Since no dispersion liquid was available with the comparative samples IV-6 and IV-8, no evaluation was made with Sample Nos. V-6, V-8, VI-6 and VI-8.

As for the comparative sample V-7, no measurement data were available, since no electrical conduction occurred. As for the comparative samples VI-7, which involved burning at the higher temperature, electrical conduction occurred but electrical resistance was larger than the samples according to the invention.

The conductive films of Sample Nos. VI-1 to VI-5 were used to manufacture electronic devices and apparatuses as shown in FIGS. 1 through 4. Accordingly, it was confirmed that efficient and reliable electronic devices and apparatuses were manufactured.

The above-mentioned results were also available when the same evaluation was carried out with metal particle dispersion liquids that had been prepared in the same manner as described above except for using gold particles or Ag—Pd alloy particles as metal particles.

Yet another specific working example according to the invention will now be described.

Method for Manufacturing Silver Dispersion Liquid (Metal Particle Dispersion Liquid)

Sample No. VII-1

A solution (thiol solution) was prepared by dissolving 0.55-gram 1-dodecanethiol in 10-ml toluene.

Separately, 5.1-gram silver nitrate monohydrate (metal salt) was dissolved in 10-ml water and was then mixed with another solution in which 19.6-gram tetraoctylammonium bromide (phase-transfer catalyst) was dissolved in 50-ml toluene. The mixture was agitated for 30 minutes at room temperature. The thiol solution was added to the mixture and then agitated for another 30 minutes to obtain a toluene/water two-phase liquid.

Subsequently, another solution was prepared by dissolving 1.3-gram borohydride sodium (reducing agent) in 200-ml water. This solution was dropped in the toluene/water two-phase liquid that had been well agitated. The liquid was further agitated for three hours at room temperature to obtain a dispersion liquid in which silver particles were dispersed. It was observed that the silver particles were in the toluene phase, while the water phase was clear and colorless. After the water phase was separated and removed, the toluene phase was concentrated to one third of its volume. Then, 70-ml ethanol was added to make the silver particles precipitate. The precipitating silver particles were made to thoroughly settle down with a centrifugal machine. Then toluene was removed to obtain the silver particles. Subsequently, the silver particles were dispersed in tetralin to obtain a silver dispersion liquid (metal particle dispersion liquid) with a silver concentration of 30 wt %. The diameter of the silver particles in the silver dispersion liquid was measured to be 2.0 nm by dynamic scattering (HPPS by Malvern). Transmission electron microscope (TEM) observation confirmed that crystalline first particles had been formed.

Sample Nos. VII-2, VII-3

Silver dispersion liquids were prepared in the same manner as Sample No. VII-1, except for changing conditions to drop the solution of borohydride sodium (reducing agent) in the toluene/water two-phase liquid and to agitate the two-phase liquid.

Sample Nos. VII-4 to VII-8

Silver dispersion liquids were prepared in the same manner as Sample No. VII-1, except for changing the volume of 1-dodecanethiol and tetralin such that the silver dispersion liquids contain 1-dodecanethiol and the silver particles as shown in Table 7.

Sample Nos. VII-9 to VII-13

Silver dispersion liquids were prepared in the same manner as Sample No. VII-2, except for changing the volume of 1-dodecanethiol and tetralin such that the silver dispersion liquids contain 1-dodecanethiol and the silver particles as shown in Table 7.

Sample Nos. VII-14 to VII-18

Silver dispersion liquids were prepared in the same manner as Sample No. VII-3, except for changing the volume of 1-dodecanethiol and tetralin such that the silver dispersion liquids contain 1-dodecanethiol and the silver particles as shown in Table 7.

Sample Nos. VII-19 to VII-21

Silver dispersion liquids were prepared with Sample Nos. VII-19 to VII-21 in the same manner as Sample No. VII-1 to VII-3, respectively, except for using 1-octanethiol instead of 1-dodecanethiol.

Sample Nos. VII-22 to VII-24

Silver dispersion liquids were prepared with Sample Nos. VII-19 to VII-21 in the same manner as Sample No. VII-1 to VII-3, respectively, except for using 1-hexanethiol instead of 1-dodecanethiol.

Sample Nos. VII-25 to VII-27

Silver dispersion liquids were prepared with Sample Nos. VII-19 to VII-21 in the same manner as Sample No. VII-1 to VII-3, respectively, except for using 1-icosanethiol instead of 1-dodecanethiol.

Sample No. VII-28

A silver dispersion liquid was prepared in the same manner as Sample No. VII-1, except for using limonene instead of tetralin to disperse silver particles.

Sample No. VII-29

A silver dispersion liquid was prepared in the same manner as Sample No. VII-1, except for using alpha-terpineol instead of tetralin to disperse silver particles.

TEM photo data revealed particle size distribution for each of the samples. The average diameter and peak half width in the size distribution were measured. Tables 7 and 8 show the conditions and measurement for each sample silver dispersion liquid.

TABLE 7

| Sample No. | Dispersion medium | Silver particle | | | Dispersing agent | | | |
| --- | --- | --- | --- | --- | --- | --- | --- | --- |
| | | Content Y [wt %] | Ave. dia A [nm] | Half width [nm] | Material | Content (Molar ratio) X | X lower limit to A | X upper limit to A |
| VII-1 (Invention) | Tetralin | 30 | 2 | 0.5 | 1-dodecanethiol | 0.1 | 0.025 | 0.5 |
| VII-2 (Invention) | Tetralin | 30 | 10 | 1 | 1-dodecanethiol | 0.1 | 0.005 | 0.1 |
| VII-3 (Comparative) | Tetralin | 30 | 110 | 10 | 1-dodecanethiol | 0.1 | 0.0004 | 0.009 |
| VII-4 (Comparative) | Tetralin | 30 | 2 | 1 | 1-dodecanethiol | 0.02 | 0.025 | 0.5 |
| VII-5 (Invention) | Tetralin | 30 | 2 | 0.5 | 1-dodecanethiol | 0.05 | ↑ | ↑ |
| VII-6 (Invention) | Tetralin | 30 | 2 | 0.5 | 1-dodecanethiol | 0.1 | ↑ | ↑ |
| VII-7 (Invention) | Tetralin | 30 | 2 | 0.5 | 1-dodecanethiol | 0.5 | ↑ | ↑ |
| VII-8 (Comparative) | Tetralin | 30 | 2 | 0.5 | 1-dodecanethiol | 1 | ↑ | ↑ |
| VII-9 (Comparative) | Tetralin | 30 | 10 | 6 | 1-dodecanethiol | 0.003 | 0.005 | 0.1 |
| VII-10 (Invention) | Tetralin | 30 | 10 | 3 | 1-dodecanethiol | 0.005 | ↑ | ↑ |
| VII-11 (Invention) | Tetralin | 30 | 10 | 1 | 1-dodecanethiol | 0.01 | ↑ | ↑ |
| VII-12 (Invention) | Tetralin | 30 | 10 | 1 | 1-dodecanethiol | 0.05 | ↑ | ↑ |
| VII-13 (Comparative) | Tetralin | 30 | 10 | 1 | 1-dodecanethiol | 0.2 | ↑ | ↑ |
| VII-14 (Comparative) | Tetralin | — | — | — | 1-dodecanethiol | 0.0002 | 0.0004 | 0.009 |
| VII-15 (Comparative) | Tetralin | 10 | 110 | 50 | 1-dodecanethiol | 0.001 | ↑ | ↑ |
| VII-16 (Comparative) | Tetralin | 10 | 110 | 30 | 1-dodecanethiol | 0.002 | ↑ | ↑ |
| VII-17 (Comparative) | Tetralin | 10 | 110 | 30 | 1-dodecanethiol | 0.005 | ↑ | ↑ |
| VII-18 (Comparative) | Tetralin | 10 | 110 | 30 | 1-dodecanethiol | 0.02 | ↑ | ↑ |

No dispersion liquid was available with Sample No. VII-14 under the above condition, since the particles coagulated soon after they had been made.

TABLE 8

| Sample No. | Dispersion medium | Silver particle Content Y [wt %] | Silver particle Ave. dia A [nm] | Silver particle Half width [nm] | Dispersing agent Material | Dispersing agent Content (Molar ratio) X | X lower limit to A | X upper limit to A |
|---|---|---|---|---|---|---|---|---|
| VII-19 (Invention) | Tetralin | 30 | 2 | 0.8 | 1-octanethiol | 0.1 | 0.025 | 0.5 |
| VII-20 (Invention) | Tetralin | 30 | 10 | 2 | 1-octanethiol | 0.1 | 0.005 | 0.1 |
| VII-21 (Comparative) | Tetralin | 30 | 110 | 20 | 1-octanethiol | 0.1 | 0.0004 | 0.009 |
| VII-22 (Comparative) | Tetralin | — | 2 | — | 1-hexanethiol | 0.1 | 0.025 | 0.5 |
| VII-23 (Comparative) | Tetralin | — | 10 | — | 1-hexanethiol | 0.1 | 0.005 | 0.1 |
| VII-24 (Comparative) | Tetralin | — | 110 | — | 1-hexanethiol | 0.1 | 0.0004 | 0.009 |
| VII-25 (Comparative) | Tetralin | 30 | 2 | 1 | 1-icosanethiol | 0.1 | 0.025 | 0.5 |
| VII-26 (Comparative) | Tetralin | 30 | 10 | 3 | 1-icosanethiol | 0.1 | 0.005 | 0.1 |
| VII-27 (Comparative) | Tetralin | 30 | 110 | 30 | 1-icosanethiol | 0.1 | 0.0004 | 0.009 |
| VII-28 (Invention) | Limonene | 30 | 2 | 0.5 | 1-dodecanethiol | 0.1 | 0.025 | 0.5 |
| VII-29 (Invention) | Alpha-terpineol | 30 | 2 | 0.5 | 1-dodecanethiol | 0.1 | 0.025 | 0.5 |

No dispersion liquid was available with Sample Nos. VII-22, 23 and 24 under the above conditions, since the particles coagulated soon after they had been made.

Dispersion Liquid Stability

The samples were left at 20 degrees Celsius for three days. They was then classified into the following four classes based on their state of silver particle dispersion.

A: A highly dispersed state of the metal particles as a dispersed substance was maintained.

B: No silver particle precipitation was observed, but there was some unevenness seemingly attributed to a variance in silver particle diameters in the dispersion liquid.

C: Some silver particle precipitation was observed.

D: Significant silver particle precipitation was observed.

Table 9 shows the classification results.

TABLE 9

| Sample No. | Dispersion liquid stability |
|---|---|
| VII-1 (Invention) | A |
| VII-2 (Invention) | A |
| VII-3 (Comparative) | C |
| VII-4 (Comparative) | D |
| VII-5 (Invention) | B |
| VII-6 (Invention) | A |
| VII-7 (Invention) | A |
| VII-8 (Comparative) | A |
| VII-9 (Comparative) | D |
| VII-10 (Invention) | B |
| VII-11 (Invention) | A |
| VII-12 (Invention) | A |
| VII-13 (Comparative) | A |
| VII-14 (Comparative) | D |
| VII-15 (Comparative) | D |
| VII-16 (Comparative) | C |
| VII-17 (Comparative) | C |
| VII-18 (Comparative) | B |
| VII-19 (Invention) | B |
| VII-20 (Invention) | B |
| VII-21 (Comparative) | C |
| VII-22 (Comparative) | D |
| VII-23 (Comparative) | D |
| VII-24 (Comparative) | D |
| VII-25 (Comparative) | B |
| VII-26 (Comparative) | B |
| VII-27 (Comparative) | B |
| VII-28 (Invention) | A |
| VII-29 (Invention) | A |

As Table 9 shows, the metal particle dispersion liquids of the samples according to the invention has high dispersion stability of the metal particles.

Making of Wiring (Conductive Film)

Sample No. VIII-1

The silver dispersion liquid of Sample No. VII-1 was discharged on a glass substrate in a line pattern with an inkjet device and dried at 110 degrees Celsius to form a film. The same process was repeated to provide another film on top of the film that had been formed.

Subsequently, the resultant film was burned at 150 degrees Celsius for 60 minutes to provide wiring (conductive film) to a line width of 50 μm and a thickness of 1 μm. This burning was carried out by ultraviolet radiation with a wavelength of 254 nm and a radiation intensity of 10 mW/cm$^2$.

Sample Nos. VIII-2 to VIII-29

Wiring (conductive films) was provided in the same manner as Sample No. VIII-1, except for using the silver dispersion liquids of Sample Nos. VII-2 to VII-29 instead of the silver dispersion liquid of Sample No. VII-1.

Sample Nos. IX-1 to IX-29

Wiring (conductive films) was provided in the same manner as Sample Nos. VIII-1 to VIII-29, except for burning was carried out at 250 degrees Celsius for 10 minutes.

Evaluation of Wiring (Conductive Film)

For each wiring (conductive films) of Sample Nos. VIII-1 to VIII-29 and Nos. IX-1 to IX-29, electrical resistance (resistivity) was measured.

Table 10 shows the measurement results.

TABLE 10

| Burning at 150 degrees C. for 60 min. | Electrical resistance (μΩcm) | Burning at 250 degrees C. for 10 min. | Electrical resistance (μΩcm) |
| --- | --- | --- | --- |
| VIII-1 (Invention) | 100 | IX-1 (Invention) | 7 |
| VIII-2 (Invention) | 120 | IX-2 (Invention) | 9 |
| VIII-3 (Comparative) | 250 | IX-3 (Comparative) | 30 |
| VIII-4 (Comparative) | 200 | IX-4 (Comparative) | 20 |
| VIII-5 (Invention) | 180 | IX-5 (Invention) | 12 |
| VIII-6 (Invention) | 100 | IX-6 (Invention) | 7 |
| VIII-7 (Invention) | 130 | IX-7 (Invention) | 10 |
| VIII-8 (Comparative) | 800 | IX-8 (Comparative) | 25 |
| VIII-9 (Comparative) | 300 | IX-9 (Comparative) | 30 |
| VIII-10 (Invention) | 140 | IX-10 (Invention) | 10 |
| VIII-11 (Invention) | 80 | IX-11 (Invention) | 6 |
| VIII-12 (Invention) | 90 | IX-12 (Invention) | 7 |
| VIII-13 (Comparative) | 280 | IX-13 (Comparative) | 20 |
| VIII-14 (Comparative) | — | IX-14 (Comparative) | — |
| VIII-15 (Comparative) | — | IX-15 (Comparative) | — |
| VIII-16 (Comparative) | — | IX-16 (Comparative) | — |
| VIII-17 (Comparative) | — | IX-17 (Comparative) | — |
| VIII-18 (Comparative) | — | IX-18 (Comparative) | — |
| VIII-19 (Invention) | 160 | IX-19 (Invention) | 12 |
| VIII-20 (Invention) | 180 | IX-20 (Invention) | 13 |
| VIII-21 (Comparative) | 500 | IX-21 (Comparative) | 45 |
| VIII-22 (Comparative) | — | IX-22 (Comparative) | — |
| VIII-23 (Comparative) | — | IX-23 (Comparative) | — |
| VIII-24 (Comparative) | — | IX-24 (Comparative) | — |
| VIII-25 (Comparative) | 1200 | IX-25 (Comparative) | 40 |
| VIII-26 (Comparative) | 1800 | IX-26 (Comparative) | 45 |
| VIII-27 (Comparative) | 2500 | IX-27 (Comparative) | 60 |
| VIII-28 (Invention) | 100 | IX-28 (Invention) | 7 |
| VIII-29 (Invention) | 110 | IX-29 (Invention) | 8 |

Poor dispersion with Sample Nos. VIII-14, 15, 16, 17 and 18 and IX-14, 15, 16, 17 and 18 resulted in inkjet clogs.
No dispersion liquid was available with Sample Nos. VIII-22, 23 and 24 and IX-22, 23 and 24.

As Table 10 shows, the wiring (conductive films) of the samples according to the invention has low electrical resistance. Furthermore, it is possible to provide wiring by burning at lower temperatures than the comparative samples. As for the wiring (conductive films) of the comparative samples, electrical resistance was larger than the samples according to the invention.

The conductive films of Sample Nos. VIII-1 to VIII-29 (except for the comparative samples) were used to manufacture electronic devices and apparatuses as shown in FIGS. 1 through 4. Accordingly, it was confirmed that efficient and reliable electronic devices and apparatuses were manufactured.

The above-mentioned results were also available when the same evaluation was carried out with metal particle dispersion liquids that had been prepared in the same manner as described above except for using gold particles or Ag—Pd alloy particles as metal particles.

Still another specific working example according to the invention will now be described.

Method for Manufacturing Silver Dispersion Liquid (Metal Particle Dispersion Liquid)

Sample No. X-1

A solution (dispersing-agent/beta-ketoester solution) was prepared by dissolving 1.2-gram 1-dodecanethiol (dispersing agent) and 4.8-gram 4,4,4-trifluoroacetoacetic acid isopropyl (beta-ketoester) in 10-ml toluene.

Separately, 5.1-gram silver nitrate monohydrate (metal salt) was dissolved in 10-ml water and was then mixed with another solution in which 19.6-gram tetraoctylammonium bromide (phase-transfer catalyst) was dissolved in 50-ml toluene. The mixture was agitated for 30 minutes at room temperature. The dispersing-agent/beta-ketoester solution was added to the mixture and then agitated for another 30 minutes to obtain a toluene/water two-phase liquid.

Subsequently, another solution was prepared by dissolving 1.3-gram borohydride sodium (reducing agent) in 200-ml water. This solution was dropped in the toluene/water two-phase liquid that had been well agitated. The liquid was further agitated for three hours at room temperature to obtain a dispersion liquid in which silver particles were dispersed. The liquid was then left for a certain period of time to separate a toluene phase and a water phase. It was observed that the silver particles were in the toluene phase, while the water phase was clear and colorless. After the water phase was separated and removed, the toluene phase was concentrated to one third of its volume. Then, 70-ml ethanol was added to make the silver particles precipitate. The precipitating silver particles were made to thoroughly settle down with a centrifugal machine. Then toluene was removed to obtain the silver particles. Subsequently, the silver particles were dispersed in tetralin to obtain a silver dispersion liquid (metal particle dispersion liquid) with a silver concentration of 30 wt %. The diameter of the silver particles in the silver dispersion liquid was measured to be 5 nm by dynamic scattering (HPPS by Malvern). Transmission electron microscope (TEM) observation confirmed that crystalline first particles had been formed.

Sample No. X-2

A silver dispersion liquid was prepared in the same manner as Sample No. X-1, except for using limonene instead of tetralin to disperse silver particles.

Sample No. X-3

A silver dispersion liquid was prepared in the same manner as Sample No. X-1, except for using alpha-terpineol instead of tetralin to disperse silver particles.

Sample Nos. X-4, X-5

Silver dispersion liquids were prepared in the same manner as Sample No. X-1, except for changing the contents of 4,4,4-trifluoroacetoacetic acid isopropyl (beta-ketoester) in the silver dispersion liquid as shown in Table 11.

Sample Nos. X-6, X-7, X-8

Silver dispersion liquids were prepared with Sample Nos. X-6, X-7 and X-8 in the same manner as Sample Nos. X-1, X-2 and X-3, respectively, except for using 3.2-gram ethyl acetoacetate instead of 4,4,4-trifluoroacetoacetic acid isopropyl as the beta-ketoester.

Sample Nos. X-9, X-10, X-11

Silver dispersion liquids were prepared with Sample Nos. with Sample Nos. X-9, X-10 and X-11 in the same manner as Sample Nos. X-1, X-2 and X-3, respectively, except for using 0.87-gram 1-octanethiol instead of 1-dodecanethiol as the dispersing agent.

Sample No. X-12

A silver dispersion liquid was prepared in the same manner as Sample No. X-1, except for using no 1-dodecanethiol.

Sample No. X-13

A silver dispersion liquid was prepared in the same manner as Sample No. X-1, except for using no 4,4,4-trifluoroacetoacetic acid isopropyl.

TEM photo data revealed particle size distribution for each of the samples. The average diameter and peak half width in the size distribution were measured. Table 11 shows the conditions and measurement for each sample silver dispersion liquid.

A: A highly dispersed state of the metal particles as a dispersed substance was maintained.

B: No silver particle precipitation was observed, but there was some unevenness seemingly attributed to a variance in silver particle diameters in the dispersion liquid.

C: Some silver particle precipitation was observed.

D: Significant silver particle precipitation was observed.

TABLE 11

| | | Ag particle | | | Dispersing agent | | | Beta-ketoester | | |
|---|---|---|---|---|---|---|---|---|---|---|
| Sample No. | Dispersion medium | Content [wt %] | Ave. dia [nm] | Half width [nm] | Material | Molecular weight | Molar ratio to Ag | Material | Molecular weight | Molar ratio to Ag |
| X-1 (Invention) | Tetralin | 30 | 5 | 0.5 | 1-dodecane thiol | 202 | 0.25 | 4,4,4-trifluoroacetoacetic acid isopropyl | 198 | 1 |
| X-2 (Invention) | Limonene | 30 | 5.4 | 0.5 | 1-dodecane thiol | 202 | 0.25 | 4,4,4-trifluoroacetoacetic acid isopropyl | 198 | 1 |
| X-3 (Invention) | Alpha-terpineol | 30 | 5.2 | 0.5 | 1-dodecane thiol | 202 | 0.25 | 4,4,4-trifluoroacetoacetic acid isopropyl | 198 | 1 |
| X-4 (Invention) | Tetralin | 30 | 4.8 | 0.5 | 1-dodecane thiol | 202 | 0.25 | 4,4,4-trifluoroacetoacetic acid isopropyl | 198 | 0.4 |
| X-5 (Invention) | Tetralin | 30 | 7 | 2 | 1-dodecane thiol | 202 | 0.25 | 4,4,4-trifluoroacetoacetic acid isopropyl | 198 | 0.1 |
| X-6 (Invention) | Tetralin | 30 | 9 | 3 | 1-dodecane thiol | 202 | 0.25 | Ethyl acetoacetate | 130 | 1 |
| X-7 (Invention) | Limonene | 30 | 12 | 4 | 1-dodecane thiol | 202 | 0.25 | Ethyl acetoacetate | 130 | 1 |
| X-8 (Invention) | Alpha-terpineol | 30 | 10 | 3 | 1-dodecane thiol | 202 | 0.25 | Ethyl acetoacetate | 130 | 1 |
| X-9 (Invention) | Tetralin | 10 | 20 | 5 | 1-octanethiol | 146 | 0.25 | 4,4,4-trifluoroacetoacetic acid isopropyl | 198 | 1 |
| X-10 (Invention) | Limonene | 10 | 25 | 7 | 1-octanethiol | 146 | 0.25 | 4,4,4-trifluoroacetoacetic acid isopropyl | 198 | 1 |
| X-11 (Invention) | Alpha-terpineol | 10 | 23 | 7 | 1-octanethiol | 146 | 0.25 | 4,4,4-trifluoroacetoacetic acid isopropyl | 198 | 1 |
| X-12 (Comparative) | Tetralin | 5 | 30 | 10 | — | — | — | 4,4,4-trifluoroacetoacetic acid isopropyl | 198 | 1 |
| X-13 (Comparative) | Tetralin | 5 | 10 | 3 | 1-dodecane thiol | 202 | 0.25 | — | — | — |

As Table 11 shows, the metal particle dispersion liquids of the samples according to the invention has a small variance in particle diameters and sharp size distribution.

Dispersion Liquid Stability

The samples were left at 20 degrees Celsius for three days. They was then classified into the following four classes based on their state of silver particle dispersion.

Table 12 shows the classification results.

TABLE 12

| Sample No. | Dispersion liquid stability |
|---|---|
| X-1 (Invention) | A |
| X-2 (Invention) | A |
| X-3 (Invention) | A |

TABLE 12-continued

| Sample No. | Dispersion liquid stability |
|---|---|
| X-4 (Invention) | A |
| X-5 (Invention) | B |
| X-6 (Invention) | B |
| X-7 (Invention) | B |
| X-8 (Invention) | B |
| X-9 (Invention) | C |
| X-10 (Invention) | C |
| X-11 (Invention) | C |
| X-12 (Comparative) | D |
| X-13 (Comparative) | C |

As Table 12 shows, the metal particle dispersion liquids of the samples according to the invention has high dispersion stability of the metal particles.

Making of Wiring (Conductive Film)

Sample No. XI-1

The silver dispersion liquid of Sample No. X-1 was discharged on a glass substrate in a line pattern with an inkjet device and dried at 110 degrees Celsius to form a film. The same process was repeated to provide another film on top of the film that had been formed.

Subsequently, the resultant film was burned at 150 degrees Celsius for 60 minutes to provide wiring (conductive film) to a line width of 50 μm and a thickness of 1 μm. This burning was carried out by ultraviolet radiation with a wavelength of 254 nm and a radiation intensity of 10 mW/cm².

Sample Nos. XI-2 to XI-13

Wiring (conductive films) was provided in the same manner as Sample No. XI-1, except for using the silver dispersion liquids of Sample Nos. X-2 to X-13 instead of the silver dispersion liquid of Sample No. X-1.

Sample Nos. XII-1 to XII-13

Wiring (conductive films) was provided in the same manner as Sample Nos. XI-1 to XI-13, except for burning was carried out at 250 degrees Celsius for 10 minutes.

Evaluation of Wiring (Conductive Film)

For each wiring (conductive films) of Sample Nos. XII-1 to XII-13, electrical resistance (resistivity) was measured.

Table 13 shows the measurement results.

TABLE 13

| Burning at 150 degrees C. for 60 min. | Electrical resistance (μΩcm) | Burning at 250 degrees C. for 10 min. | Electrical resistance (μΩcm) |
|---|---|---|---|
| XI-1 (Invention) | 120 | XII-1 (Invention) | 10 |
| XI-2 (Invention) | 150 | XII-2 (Invention) | 12 |
| XI-3 (Invention) | 140 | XII-3 (Invention) | 11 |
| XI-4 (Invention) | 100 | XII-4 (Invention) | 8 |
| XI-5 (Invention) | 200 | XII-5 (Invention) | 15 |
| XI-6 (Invention) | 500 | XII-6 (Invention) | 30 |
| XI-7 (Invention) | 1000 | XII-7 (Invention) | 40 |
| XI-8 (Invention) | 800 | XII-8 (Invention) | 35 |
| XI-9 (Invention) | 160 | XII-9 (Invention) | 13 |
| XI-10 (Invention) | 200 | XII-10 (Invention) | 16 |
| XI-11 (Invention) | 180 | XII-11 (Invention) | 14 |
| XI-12 (Comparative) | 4000 | XII-12 (Comparative) | 80 |
| XI-13 (Comparative) | 3500 | XII-13 (Comparative) | 50 |

As Table 13 shows, the wiring (conductive films) of the samples according to the invention has low electrical resistance. Furthermore, it is possible to provide wiring by burning at lower temperatures than the comparative samples.

As for the wiring (conductive films) of the comparative samples, electrical resistance was definitely larger than the samples according to the invention.

The conductive films of Sample Nos. XI-1 to XI-11 were used to manufacture electronic devices and apparatuses as shown in FIGS. 1 through 4. Accordingly, it was confirmed that efficient and reliable electronic devices and apparatuses were manufactured by low-temperature processing.

The above-mentioned results were also available when the same evaluation was carried out with metal particle dispersion liquids that had been prepared in the same manner as described above except for using gold particles or Ag—Pd alloy particles as metal particles.

What is claimed is:

1. A metal particle dispersion liquid, comprising:
   a plurality of metal particles;
   a plurality of thiols, one of the plurality of thiols having 8 to 18 carbon atoms; and
   a dispersion medium,
   the one of the plurality of thiols having the 8 to 18 carbon atoms being disposed at a surface of one metal particle of the plurality of metal particles,
   the metal particle dispersion liquid satisfying the equation $0.05/A \leqq X \leqq 1.00/A$, wherein A is an average diameter in nm of the plurality of metal particles and X is a molar ratio of the plurality of thiols relative to atoms of the plurality of metal particles.

2. The metal particle dispersion liquid according to claim 1, an average diameter range of the one metal particle of the plurality of metal particles being 1 to 100 nm.

3. The metal particle dispersion liquid according to claim 1, further comprising a dispersion aid.

4. The metal particle dispersion liquid according to claim 1, the one of the plurality of thiols having the 8 to 18 carbon atoms covering the one metal particle of the plurality of metal particles.

5. The metal particle dispersion liquid according to claim 1, the one metal particle of the plurality of metal particles including one of Ag, Au, Pt, Pd, Ru, Rh, Os, Ir, Cu, Al, Ni, Sn and Mg.

6. The metal particle dispersion liquid according to claim 5, an amount of the one of Ag, Au, Pt, Pd, Ru, Rh, Os and Ir in the one metal particle of the plurality of metal particles being 90 wt % or more.

7. The metal particle dispersion liquid according to claim 3, the dispersion aid including beta-ketoester.

* * * * *